(12) United States Patent
Chitnis et al.

(10) Patent No.: US 9,159,888 B2
(45) Date of Patent: Oct. 13, 2015

(54) WAFER LEVEL PHOSPHOR COATING METHOD AND DEVICES FABRICATED UTILIZING METHOD

(75) Inventors: Ashay Chitnis, Goleta, CA (US); James Ibbetson, Santa Barbara, CA (US); Bernd Keller, Santa Barbara, CA (US); David T. Emerson, Chapel Hill, NC (US); John Edmond, Cary, NC (US); Michael J. Bergmann, Chapel Hill, NC (US); Jasper S. Cabalu, Cary, NC (US); Jeffrey C. Britt, Cary, NC (US); Arpan Chakraborty, Goleta, CA (US); Eric Tarsa, Goleta, CA (US); James Seruto, Goleta, CA (US); Yankun Fu, Raleigh, NC (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/899,790

(22) Filed: Sep. 7, 2007
(Under 37 CFR 1.47)

(65) Prior Publication Data
US 2008/0179611 A1 Jul. 31, 2008

Related U.S. Application Data

(63) Continuation-in-part of application No. 11/656,759, filed on Jan. 22, 2007.

(51) Int. Cl.
*H01L 33/00* (2010.01)
*H01L 33/50* (2010.01)
(Continued)

(52) U.S. Cl.
CPC ............. *H01L 33/508* (2013.01); *H01L 33/62* (2013.01); *H01L 33/0095* (2013.01); *H01L 33/36* (2013.01);
(Continued)

(58) Field of Classification Search
CPC ....... H01L 33/22; H01L 33/387; H01L 33/44; H01L 33/502; H01L 33/505; H01L 33/36; H01L 33/38
USPC ................ 257/98, 100, 95, E33.06, E33.061, 257/E33.062
See application file for complete search history.

(56) References Cited

U.S. PATENT DOCUMENTS

| 3,780,357 A | 12/1973 | Haitz |
| 4,576,796 A | 3/1986 | McCormick |

(Continued)

FOREIGN PATENT DOCUMENTS

| CN | 2310925 | 3/1999 |
| CN | 2310925 Y | 3/1999 |

(Continued)

OTHER PUBLICATIONS

Office Action from parent U.S. Appl. No. 11/656,759, mailed: Feb. 27, 2009.

(Continued)

*Primary Examiner* — Kimberly Rizkallah
*Assistant Examiner* — Maria Ligai
(74) *Attorney, Agent, or Firm* — Koppel, Patrick, Heybl & Philpott

(57) ABSTRACT

Methods for fabricating light emitting diode (LED) chips comprising providing a plurality of LEDs typically on a substrate. Pedestals are deposited on the LEDs with each of the pedestals in electrical contact with one of the LEDs. A coating is formed over the LEDs with the coating burying at least some of the pedestals. The coating is then planarized to expose at least some of the buried pedestals while leaving at least some of said coating on said LEDs. The exposed pedestals can then be contacted such as by wire bonds. The present invention discloses similar methods used for fabricating LED chips having LEDs that are flip-chip bonded on a carrier substrate and for fabricating other semiconductor devices. LED chip wafers and LED chips are also disclosed that are fabricated using the disclosed methods.

58 Claims, 20 Drawing Sheets

(51) Int. Cl.
   *H01L 33/62* (2010.01)
   *H01L 33/38* (2010.01)
   *H01L 33/36* (2010.01)
   *H01L 33/44* (2010.01)
   *H01L 33/54* (2010.01)

(52) U.S. Cl.
   CPC .............. *H01L 33/387* (2013.01); *H01L 33/44* (2013.01); *H01L 33/505* (2013.01); *H01L 33/54* (2013.01); *H01L 2924/0002* (2013.01); *H01L 2933/0091* (2013.01)

(56) References Cited

U.S. PATENT DOCUMENTS

| | | | |
|---|---|---|---|
| 4,733,335 A | 3/1988 | Serizawa et al. | 362/503 |
| 4,918,497 A | 4/1990 | Edmond | 357/17 |
| 4,935,665 A | 6/1990 | Murata | 313/500 |
| 4,946,547 A | 8/1990 | Palmour et al. | 156/643 |
| 4,966,862 A | 10/1990 | Edmond | 437/100 |
| 5,027,168 A | 6/1991 | Edmond | 357/17 |
| 5,200,022 A | 4/1993 | Kong et al. | 156/612 |
| 5,210,051 A | 5/1993 | Carter, Jr. | 437/107 |
| 5,277,840 A | 1/1994 | Osaka et al. | 252/301.36 |
| 5,338,944 A | 8/1994 | Edmond et al. | 257/76 |
| RE34,861 E | 2/1995 | Davis et al. | 437/100 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |
| 5,631,190 A | 5/1997 | Negley | 438/33 |
| 5,739,554 A | 4/1998 | Edmond et al. | 257/103 |
| 5,766,987 A | 6/1998 | Mitchell et al. | 438/126 |
| 5,813,753 A | 9/1998 | Vriens et al. | |
| 5,849,354 A | 12/1998 | Tsuchiyama | 427/73 |
| 5,858,278 A | 1/1999 | Itoh et al. | 252/301.4 R |
| 5,912,477 A | 6/1999 | Negley | 257/95 |
| 5,923,053 A | 7/1999 | Jakowetz et al. | 257/95 |
| 5,959,316 A | 9/1999 | Lowery | |
| 5,988,925 A | 12/1999 | Shimizu | 313/503 |
| 6,001,671 A | 12/1999 | Fjelstad | 438/112 |
| 6,056,421 A | 5/2000 | Johnson et al. | |
| 6,066,861 A | 5/2000 | Hohn et al. | |
| 6,069,440 A | 5/2000 | Shimizu et al. | 313/486 |
| 6,087,202 A | 7/2000 | Exposito et al. | 438/113 |
| 6,120,600 A | 9/2000 | Edmond et al. | 117/89 |
| 6,132,072 A | 10/2000 | Turnbull et al. | 362/494 |
| 6,139,304 A | 10/2000 | Centofante | 425/121 |
| 6,153,448 A | 11/2000 | Takahashi et al. | |
| 6,157,086 A | 12/2000 | Weber | 257/788 |
| 6,187,606 B1 | 2/2001 | Edmond et al. | 438/46 |
| 6,201,262 B1 | 3/2001 | Edmond et al. | 257/77 |
| 6,252,254 B1 | 6/2001 | Soules et al. | 257/89 |
| 6,257,737 B1 | 7/2001 | Marshall et al. | |
| 6,274,890 B1 | 8/2001 | Oshio et al. | |
| 6,329,224 B1 | 12/2001 | Nguyen et al. | 438/127 |
| 6,331,063 B1 | 12/2001 | Kamada et al. | 362/237 |
| 6,333,522 B1 | 12/2001 | Inoue et al. | 257/99 |
| 6,338,813 B1 | 1/2002 | Hsu et al. | 264/272.14 |
| 6,366,018 B1 | 4/2002 | Garbuzov et al. | |
| 6,376,277 B2 | 4/2002 | Corisis | 438/106 |
| 6,404,125 B1 | 6/2002 | Garbuzov | 313/499 |
| 6,468,832 B1 | 10/2002 | Mostafazadeh | 438/112 |
| 6,501,100 B1 | 12/2002 | Srivastava | |
| 6,504,180 B1* | 1/2003 | Heremans et al. | 257/98 |
| 6,522,065 B1 | 2/2003 | Srivastava | |
| 6,531,328 B1 | 3/2003 | Chen | 438/26 |
| 6,580,097 B1 | 6/2003 | Soules et al. | |
| 6,583,444 B2 | 6/2003 | Fjelstad | 257/82 |
| 6,624,058 B1 | 9/2003 | Kazama | 438/612 |
| 6,642,652 B2 | 11/2003 | Collins, III et al. | 313/512 |
| 6,650,044 B1 | 11/2003 | Lowery | 313/502 |
| 6,653,765 B1 | 11/2003 | Levinson et al. | |
| 6,664,560 B2 | 12/2003 | Emerson et al. | |
| 6,686,676 B2 | 2/2004 | McNulty | |
| 6,733,711 B2 | 5/2004 | Durocher et al. | 264/272.14 |
| 6,734,033 B2 | 5/2004 | Emerson et al. | |
| 6,744,196 B1 | 6/2004 | Jeon | 313/498 |
| 6,759,266 B1 | 7/2004 | Hoffman | 438/64 |
| 6,791,119 B2 | 9/2004 | Slater, Jr. et al. | 257/99 |
| 6,791,259 B1 | 9/2004 | Stokes | |
| 6,793,371 B2 | 9/2004 | Lamke et al. | 362/241 |
| 6,812,500 B2 | 11/2004 | Reeh et al. | 257/98 |
| 6,853,010 B2 | 2/2005 | Slater, Jr. et al. | 257/98 |
| 6,860,621 B2 | 3/2005 | Bachl et al. | 362/373 |
| 6,919,683 B1 | 7/2005 | Jang | 313/503 |
| 6,924,233 B1 | 8/2005 | Chua et al. | |
| 6,936,862 B1 | 8/2005 | Chang et al. | |
| 6,939,481 B2 | 9/2005 | Srivastava | |
| 6,958,497 B2 | 10/2005 | Emerson et al. | 257/94 |
| 6,967,116 B2 | 11/2005 | Negley | |
| 7,023,019 B2 | 4/2006 | Maeda | |
| 7,029,935 B2 | 4/2006 | Negley et al. | |
| 7,042,020 B2 | 5/2006 | Negley | |
| 7,049,159 B2 | 5/2006 | Lowery | 438/22 |
| 7,078,737 B2 | 7/2006 | Yuri | |
| 7,183,586 B2 | 2/2007 | Ichihara | |
| 7,183,587 B2 | 2/2007 | Negley et al. | 257/99 |
| 7,202,598 B2 | 4/2007 | Juestel et al. | 313/503 |
| 7,246,923 B2 | 7/2007 | Conner | |
| 7,259,402 B2 | 8/2007 | Edmond et al. | |
| 7,286,296 B2 | 10/2007 | Chaves et al. | 359/641 |
| 7,566,639 B2 | 7/2009 | Kohda | 438/463 |
| 7,601,550 B2 | 10/2009 | Bogner | |
| 7,714,342 B2 | 5/2010 | Lee et al. | 257/98 |
| 7,714,348 B2 | 5/2010 | Fan et al. | 257/99 |
| 8,610,145 B2 | 12/2013 | Yano | 257/98 |
| 2001/0000622 A1 | 5/2001 | Reeh et al. | |
| 2001/0007484 A1 | 7/2001 | Sakamaki | 349/2 |
| 2001/0015442 A1 | 8/2001 | Kondoh et al. | 257/79 |
| 2001/0019177 A1 | 9/2001 | Sugihara | 257/780 |
| 2001/0038166 A1 | 11/2001 | Weber | 264/272 |
| 2002/0001869 A1 | 1/2002 | Fjelstad | |
| 2002/0006040 A1 | 1/2002 | Kamada et al. | |
| 2002/0048905 A1 | 4/2002 | Ikegami et al. | 438/464 |
| 2002/0056847 A1* | 5/2002 | Uemura et al. | 257/89 |
| 2002/0063520 A1 | 5/2002 | Yu et al. | |
| 2002/0070449 A1 | 6/2002 | Yagi et al. | |
| 2002/0088985 A1 | 7/2002 | Komoto et al. | |
| 2002/0096789 A1 | 7/2002 | Bolken | |
| 2002/0105266 A1 | 8/2002 | Juestel et al. | |
| 2002/0123164 A1 | 9/2002 | Slater, Jr. et al. | |
| 2002/0158578 A1* | 10/2002 | Eliashevich et al. | 313/512 |
| 2002/0185965 A1 | 12/2002 | Collins, III et al. | |
| 2003/0006418 A1 | 1/2003 | Emerson et al. | |
| 2003/0038596 A1 | 2/2003 | Ho | |
| 2003/0066311 A1 | 4/2003 | Li et al. | |
| 2003/0079989 A1 | 5/2003 | Klocke et al. | |
| 2003/0121511 A1 | 7/2003 | Hashimura et al. | |
| 2003/0181122 A1 | 9/2003 | Collins et al. | 445/24 |
| 2003/0207500 A1 | 11/2003 | Pichler et al. | |
| 2004/0004435 A1 | 1/2004 | Hsu | |
| 2004/0012958 A1 | 1/2004 | Hashimoto et al. | |
| 2004/0037949 A1 | 2/2004 | Wright | |
| 2004/0038442 A1 | 2/2004 | Kinsman | |
| 2004/0041159 A1 | 3/2004 | Yuri et al. | |
| 2004/0041222 A1 | 3/2004 | Loh | |
| 2004/0056260 A1 | 3/2004 | Slater et al. | 257/79 |
| 2004/0061115 A1 | 4/2004 | Kozawa et al. | |
| 2004/0061433 A1* | 4/2004 | Izuno et al. | 313/498 |
| 2004/0106234 A1 | 6/2004 | Sorg et al. | |
| 2004/0124429 A1 | 7/2004 | Stokes | |
| 2004/0140765 A1 | 7/2004 | Takekuma et al. | |
| 2004/0164307 A1 | 8/2004 | Mueller-Mach et al. | |
| 2004/0164311 A1 | 8/2004 | Uemura | |
| 2004/0170018 A1 | 9/2004 | Nawashiro | |
| 2004/0173806 A1 | 9/2004 | Chua | |
| 2004/0180475 A1 | 9/2004 | Shibata et al. | 438/127 |
| 2004/0188697 A1* | 9/2004 | Brunner et al. | 257/99 |
| 2004/0245530 A1 | 12/2004 | Kameyama | |
| 2004/0256974 A1 | 12/2004 | Mueller-Mach et al. | |
| 2004/0263073 A1 | 12/2004 | Baroky et al. | 313/512 |
| 2005/0001225 A1 | 1/2005 | Yoshimura et al. | |

(56) References Cited

U.S. PATENT DOCUMENTS

| | | |
|---|---|---|
| 2005/0002168 A1 | 1/2005 | Narhi et al. |
| 2005/0062140 A1 | 3/2005 | Leung et al. |
| 2005/0080193 A1 | 4/2005 | Wouters et al. ............... 525/191 |
| 2005/0122031 A1 | 6/2005 | Itai |
| 2005/0145991 A1 | 7/2005 | Sakamoto et al. |
| 2005/0167682 A1 | 8/2005 | Fukasawa |
| 2005/0184305 A1* | 8/2005 | Ueda ............................... 257/99 |
| 2005/0184638 A1 | 8/2005 | Mueller |
| 2005/0194606 A1 | 9/2005 | Oohata ............................ 257/99 |
| 2005/0196886 A1 | 9/2005 | Jager et al. |
| 2005/0211991 A1 | 9/2005 | Mori et al. |
| 2005/0219835 A1 | 10/2005 | Nagayama |
| 2005/0221519 A1 | 10/2005 | Leung et al. |
| 2005/0243237 A1 | 11/2005 | Sasuga ............................ 349/57 |
| 2005/0259423 A1 | 11/2005 | Heuser et al. ................. 362/293 |
| 2005/0265404 A1 | 12/2005 | Ashdown |
| 2005/0269592 A1 | 12/2005 | Lee et al. ....................... 257/100 |
| 2006/0001046 A1 | 1/2006 | Batres et al. |
| 2006/0001466 A1 | 1/2006 | Luecke et al. |
| 2006/0003477 A1* | 1/2006 | Braune et al. .................... 438/29 |
| 2006/0027820 A1 | 2/2006 | Cao ................................. 257/89 |
| 2006/0060867 A1 | 3/2006 | Suehiro |
| 2006/0060872 A1 | 3/2006 | Edmond et al. |
| 2006/0060874 A1 | 3/2006 | Edmond et al. |
| 2006/0060879 A1 | 3/2006 | Edmond et al. |
| 2006/0065906 A1 | 3/2006 | Harada |
| 2006/0091788 A1 | 5/2006 | Yan |
| 2006/0102991 A1 | 5/2006 | Sakano |
| 2006/0124947 A1 | 6/2006 | Mueller et al. .................. 257/98 |
| 2006/0138937 A1 | 6/2006 | Ibbetson |
| 2006/0145170 A1* | 7/2006 | Cho ................................. 257/95 |
| 2006/0157721 A1* | 7/2006 | Tran et al. ........................ 257/98 |
| 2006/0189098 A1 | 8/2006 | Edmond |
| 2006/0202105 A1 | 9/2006 | Krames et al. |
| 2006/0267042 A1 | 11/2006 | Izuno |
| 2006/0284195 A1 | 12/2006 | Nagai |
| 2007/0012940 A1 | 1/2007 | Suh et al. |
| 2007/0034995 A1 | 2/2007 | Kameyama |
| 2007/0037307 A1 | 2/2007 | Donofrio |
| 2007/0092636 A1 | 4/2007 | Thompson et al. |
| 2007/0096131 A1 | 5/2007 | Chandra |
| 2007/0114559 A1 | 5/2007 | Sayers et al. ................... 257/100 |
| 2007/0138941 A1 | 6/2007 | Jin et al. ......................... 313/503 |
| 2007/0158668 A1* | 7/2007 | Tarsa et al. ...................... 257/98 |
| 2007/0158669 A1 | 7/2007 | Lee et al. |
| 2007/0215890 A1 | 9/2007 | Harbers |
| 2007/0257335 A1 | 11/2007 | O'Brien ......................... 257/618 |
| 2007/0259206 A1 | 11/2007 | Oshio |
| 2007/0278502 A1* | 12/2007 | Shakuda et al. ................. 257/88 |
| 2008/0006815 A1 | 1/2008 | Wang et al. |
| 2008/0121911 A1 | 5/2008 | Andrews et al. ................. 257/98 |
| 2008/0149945 A1 | 6/2008 | Nagai |
| 2008/0173884 A1 | 7/2008 | Chitnis et al. ................... 257/98 |
| 2008/0203410 A1 | 8/2008 | Brunner et al. |
| 2008/0283865 A1 | 11/2008 | Yoo |
| 2009/0086492 A1 | 4/2009 | Meyer ............................ 362/294 |
| 2009/0101930 A1 | 4/2009 | Li ................................... 257/97 |
| 2009/0154195 A1 | 6/2009 | Ishii et al. ....................... 362/612 |
| 2009/0268461 A1 | 10/2009 | Deak et al. |
| 2009/0322197 A1 | 12/2009 | Helbing .......................... 313/46 |
| 2012/0043886 A1 | 2/2012 | Ji et al. ............................ 315/51 |

FOREIGN PATENT DOCUMENTS

| | | |
|---|---|---|
| CN | 1372330 A | 10/2002 |
| CN | 1455960 | 11/2003 |
| CN | 1476050 | 2/2004 |
| CN | 1547265 | 11/2004 |
| CN | 1866561 A | 11/2006 |
| DE | 19638667 | 4/1998 |
| DE | 19945672 A1 | 4/2000 |
| DE | 102005000800 | 8/2005 |
| DE | 102005013265 | 12/2005 |
| DE | 102005042814 | 4/2006 |
| DE | 102005062514 | 3/2007 |
| DE | 102005058127 | 6/2007 |
| DE | 102007022090 | 11/2008 |
| EP | 0732740 A2 | 9/1996 |
| EP | 1017112 | 7/2000 |
| EP | 1059678 | 12/2000 |
| EP | 1 138 747 A2 | 10/2001 |
| EP | 1138747 | 10/2001 |
| EP | 1198016 A2 | 10/2001 |
| EP | 1198005 A1 | 4/2002 |
| EP | 1198016 A2 | 4/2002 |
| EP | 1367655 A1 | 3/2003 |
| EP | 1367655 | 12/2003 |
| EP | 1385215 A2 | 1/2004 |
| EP | 1601030 A2 | 11/2005 |
| EP | 1724848 | 11/2006 |
| EP | 1724848 A | 11/2006 |
| EP | 1724848 A2 | 11/2006 |
| EP | 1804304 A2 | 7/2007 |
| EP | 1935452 A1 | 6/2008 |
| FR | 2704690 | 11/1994 |
| FR | 2704690 A | 11/1994 |
| GB | 69702929 | 2/2001 |
| JP | 61048951 | 3/1986 |
| JP | 59027559 | 2/1987 |
| JP | 02-086150 | 3/1990 |
| JP | 4233454 | 8/1992 |
| JP | 10107325 | 4/1998 |
| JP | H10107325 | 4/1998 |
| JP | 10-163525 | 6/1998 |
| JP | 10163525 | 6/1998 |
| JP | 10163525 A | 6/1998 |
| JP | 10247750 A | 9/1998 |
| JP | 10261821 A | 9/1998 |
| JP | H0261821 | 9/1998 |
| JP | 11087778 | 3/1999 |
| JP | 11276932 | 10/1999 |
| JP | 2000002802 | 1/2000 |
| JP | 2002101147 | 4/2000 |
| JP | 2000-164937 A | 6/2000 |
| JP | 2000164930 | 6/2000 |
| JP | 2000164937 | 6/2000 |
| JP | 20001649370 | 6/2000 |
| JP | 2000208820 | 7/2000 |
| JP | 2000208820 A | 7/2000 |
| JP | 2000243728 | 8/2000 |
| JP | 2000277551 A | 10/2000 |
| JP | 2000-349346 | 12/2000 |
| JP | 2000349346 | 12/2000 |
| JP | 2001308116 A | 11/2001 |
| JP | 2001345480 | 12/2001 |
| JP | 2002009097 A | 1/2002 |
| JP | 2002-050799 | 2/2002 |
| JP | 2002-50799 A | 2/2002 |
| JP | 2002-050799 A | 2/2002 |
| JP | 200250799 | 2/2002 |
| JP | 2002050799 | 2/2002 |
| JP | 2002-076446 | 3/2002 |
| JP | 2002-093830 | 3/2002 |
| JP | 2002076445 | 3/2002 |
| JP | 2002-118293 * | 4/2002 |
| JP | 2002118293 | 4/2002 |
| JP | 2002118293 A | 4/2002 |
| JP | 2002-531955 | 9/2002 |
| JP | 2002-531956 | 9/2002 |
| JP | 2002261325 | 9/2002 |
| JP | 2002280607 | 9/2002 |
| JP | 2002319704 | 10/2002 |
| JP | 2002374006 | 12/2002 |
| JP | 2003-007929 | 1/2003 |
| JP | 20037929 A | 1/2003 |
| JP | 2003007929 | 1/2003 |
| JP | 2003046141 | 2/2003 |
| JP | 2003-115614 | 4/2003 |
| JP | 2003110153 | 4/2003 |
| JP | 2003115614 | 4/2003 |
| JP | 2003-170465 | 6/2003 |
| JP | 2003-197655 | 7/2003 |
| JP | 2003224307 | 8/2003 |

(56) References Cited

FOREIGN PATENT DOCUMENTS

| JP | 2003234511 | 8/2003 |
|---|---|---|
| JP | 2003-258011 | 9/2003 |
| JP | 2003-526212 | 9/2003 |
| JP | 2003-318448 | 11/2003 |
| JP | 2003-533852 | 11/2003 |
| JP | 2004-031856 | 1/2004 |
| JP | 2004-501512 | 1/2004 |
| JP | 2004031856 | 1/2004 |
| JP | 2004095765 | 3/2004 |
| JP | 2004134699 | 4/2004 |
| JP | 2004186488 | 7/2004 |
| JP | 2004-266240 | 9/2004 |
| JP | 2004266240 | 9/2004 |
| JP | 3589187 B2 | 11/2004 |
| JP | 2004-363342 | 12/2004 |
| JP | 2004363342 | 12/2004 |
| JP | 2005019838 | 1/2005 |
| JP | 2005064113 | 3/2005 |
| JP | 2005167079 | 6/2005 |
| JP | 2005-252222 | 9/2005 |
| JP | 2005252222 | 9/2005 |
| JP | 2005298817 | 10/2005 |
| JP | 2006032387 | 2/2006 |
| JP | 2006054209 | 2/2006 |
| JP | 20060495533 | 2/2006 |
| JP | 2006080565 | 3/2006 |
| JP | 2006114637 | 4/2006 |
| JP | 2006165416 | 6/2006 |
| JP | 2006245020 | 6/2006 |
| JP | 2006-245020 | 9/2006 |
| JP | 2006-253370 | 9/2006 |
| JP | 2006253370 | 9/2006 |
| JP | 2006313886 | 11/2006 |
| JP | 2007063538 | 3/2007 |
| JP | 2008-129043 A | 6/2008 |
| JP | 2008532281 | 8/2008 |
| JP | 2008-218511 A | 9/2008 |
| JP | 2000-299334 | 10/2010 |
| KR | 200412776 | 2/2004 |
| KR | 2004-0017926 | 3/2004 |
| KR | 200417926 | 3/2004 |
| KR | 200429313 | 4/2004 |
| TW | 522423 | 3/2003 |
| TW | 581325 U | 3/2004 |
| TW | 585012 | 6/2004 |
| TW | 595012 | 6/2004 |
| WO | WO 2006033695 A2 | 3/2000 |
| WO | WO 00/33390 | 6/2000 |
| WO | WO 0124283 | 4/2001 |
| WO | WO 0124283 A | 4/2001 |
| WO | WO 0124283 A1 | 4/2001 |
| WO | WO 02061847 A2 | 8/2002 |
| WO | WO 03001612 | 1/2003 |
| WO | WO 03/021668 | 3/2003 |
| WO | WO 03/021668 A1 | 3/2003 |
| WO | WO 03021691 A1 | 3/2003 |
| WO | WO 2004020704 | 3/2004 |
| WO | WO 2005101445 A1 | 10/2005 |
| WO | WO 2005101909 | 10/2005 |
| WO | WO 2005121641 A1 | 12/2005 |
| WO | WO 2006036251 A1 | 4/2006 |
| WO | WO 2006/065015 | 6/2006 |
| WO | WO 2006135496 A2 | 12/2006 |
| WO | WO 2007018560 | 2/2007 |
| WO | WO 2007107903 A1 | 9/2007 |
| WO | WO 2007136956 | 11/2007 |
| WO | WO 2008003176 A1 | 1/2008 |
| WO | WO 2009060356 A2 | 5/2009 |
| WO | WO 2010035171 A2 | 4/2010 |

OTHER PUBLICATIONS

Reply to Office Action from parent U.S. Appl. No. 11/656,759, dated: Jul. 24, 2009.
Office Action from parent U.S. Appl. No. 11/656,759, mailed: Nov. 25, 2009.
Office Action from related U.S. Appl. No. 10/666,399, mailed: Dec. 22, 2009.
Office Action from related U.S. Appl. No. 11/982,276, mailed: Mar. 25. 2010.
Office Action from related U.S. Appl. No. 11/656,759, dated: Feb. 27, 2009.
Response from related Office Action U.S. Appl. No. 11/656,759, dated: Jul. 24, 2009.
Office Action from related U.S. Appl. No. 11/656,759, dated: Nov. 25, 2009.
Response from related Office Action U.S. Appl. No. 11/656,759, dated: Apr. 26, 2010.
Japanese Publication No. JP2005033138(A), Date: Feb. 3, 2005 to Shoji Iwao; Fujisawa Shigeo.
Examination of related European Application No. 05 808 825.3-2203, Dated: Mar. 18, 2009.
PCT Search Report and Written Opinion Oct. 31, 2007.
International Search Report for PCT/US2007/024367, Dated: Oct. 22, 2008.
Office Action re related U.S. Appl. No. 10/666,399, dated: Sep. 5, 2008.
Nichia Corp. White LED Part No. NSPW300BS, Specification for Nichia White LED, Model NSPW300BS Jan. 14, 2004.
Nichia Corp. White LED Part No. NSPW312BS, Specification for Nichia White LED, Model NSPW312BS Jan. 14, 2004.
Lau, John, "Flip-Chip Technologies", McGraw Hill, 1996.
International Materials Reviews "Materials for Field Emission Displays", A.P. Burden 2001.
NPO-30394 Electrophoretic Deposition for Fabricating Microbatteries p. 1-2, NASA Tech Briefs Issue May 3, 2003.
Official Notice of Rejection Mailed Jul. 29, 2008, Japanese Patent Application No. 2007-533459.
Patent Abstracts of Japan 2004-221185 Aug. 5, 2004.
Patent Abstracts of Japan 11-040858, Feb. 12, 1999.
Patent Abstract of Japan 2001-181613, Jul. 3, 2001.
International Search Report and Written Opinion from related PCT Application No. PCT/US2009/001572, dated: Jul. 17, 2009.
PCT International Search Report and Written Opinion, PCT/US2007/024366,Date: Jul. 15, 2008.
PCT/US2007/024366 Partial International Search Report.
Official Notice of Final Decision of Rejection re: related Japanese Patent Application No. 2007-533459, dated: Dec. 26, 2008.
Rejection Decision re: related Chinese Patent Application No. 200580031382.3, dated: Feb. 2, 2009.
Communication pursuant to Article 94(3) EPC re: related European Application No. 05808825.3, dated: Feb. 18, 2009.
From related application. Japanese Patent Application No. 2006-526964, Official Notice of Rejection, mailed Feb. 16, 2010.
Patent Abstracts of Japan, Publication No. 2003-258011 dated Sep. 12, 2003.
Patent Abstracts of Japan, Publication No. 2002-093830 dated Mar. 29, 2002.
Office Action from related U.S. Appl. No. 11/982,276, dated Dec. 7, 2009.
Office Action from related U.S. Appl. No. 12/077,638, dated; Dec. 8, 2009.
Official Notice of Rejection re related Japanese Patent Application No. 2007-533459, Dated: Jul. 29, 2008.
Patent Abstracts of Japan, Pub. No. 2001-181613,Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.
Notice on Reexamination for Chinese Patent Application No. 200580031382.3 mailed May 28, 2010.
Patent Abstracts of Japan No. 2002-050799 dated Feb. 15, 2002 to Stanley Electric Co. Ltd.
Office Action from Japanese Patent Application No. 2007-533459 (Appeal No. 2009-006588) mailed Jul. 16, 2010.
Office Action from Chinese Patent Application No. 200780012387.0 mailed Jun. 30, 2010.
Summons for Oral Proceedings for European Patent Application No. 05808825.3 dated Sep. 9, 2010.

(56) References Cited

OTHER PUBLICATIONS

Notification of the First Office Action for counterpart Chinese Patent Application No. 200780050127.2 mailed Aug. 8, 2010.
Notice of Rejection for Japanese Patent Application No. 2006-526964 issued Oct. 5, 2010.
Notification of the First Office Action for counterpart Chinese Patent Application No. 200780050197.8 dated Sep. 9, 2010.
Reexamination Decision No. 27346 for Chinese Patent Application No. 200580031382.3 dated Oct. 27, 2010.
Office Action from U.S. Appl. No. 11/595,720, dated May 14, 2010.
Office Action from U.S. Appl. No. 11/827,626, dated Oct. 7, 2010.
Office Action from U.S. Appl. No. 12/008,477, dated Oct. 7, 2010.
Office Action from U.S. Appl. No. 11/881,683, dated May 12, 2010.
Office Action from U.S. Appl. No. 11/899,790, dated Jun. 2, 2010.
Office Action from U.S. Appl. No. 12/506,989, dated Mar. 8, 2011.
Office Action from U.S. Appl. No. 12/008,477, dated Mar. 1, 2010.
Office Action from U.S. Appl. No. 11/982,276, dated Aug. 19, 2010.
Office Action from U.S. Appl. No. 12/506,989, dated Jul. 23, 2010.
Office Action from U.S. Appl. No. 12/077,638, dated Jul. 7, 2010.
Office Action from U.S. Appl. No. 10/666,399, dated May 11, 2010.
Office Action from U.S. Appl. No. 11/881,683, dated Feb. 5, 2010.
Office Action from U.S. Appl. No. 11/982,276, dated Feb. 18, 2010.
Office Action from U.S. Appl. No. 11/398,214, dated Nov. 12, 2010.
Office Action from U.S. Appl. No. 11/398,214, dated Dec. 11, 2009.
Office Action from U.S. Appl. No. 11/656,759, dated May 21, 2010.
Office Action from U.S. Appl. No. 11/656,759, dated Mar. 9, 2011.
Office Action from U.S. Appl. No. 12/077,638, dated Dec. 21, 2010.
Office Action from U.S. Appl. No. 12/077,638, dated Sep. 22, 2010.
Response to Office Action U.S. Appl. No. 11/398,214, OA dated Dec. 11, 2009, Resp. filed Mar. 2, 2010.
Response to Office Action U.S. Appl. No. 10/666,399, OA dated May 11, 2010, Resp. filed Aug. 11, 2010.
Response to Office Action U.S. Appl. No. 11/595,720, OA dated May 14, 2010, Resp. filed Jul. 6, 2010.
Response to Office Action U.S. Appl. No. 12/008,477, OA dated Mar. 1, 2010, Resp. filed May 26, 2010.
Response to Office Action U.S. Appl. No. 12/077,638, OA dated Dec. 8, 2009, Resp. filed Feb. 26, 2010.
Response to Office Action U.S. Appl. No. 12/077,638, OA dated Jul. 7, 2010, Resp. filed Aug. 30, 2010.
Response to Office Action U.S. Appl. No. 11/982,276, OA dated Mar. 25, 2010, Resp. filed Jun, 21, 2010.
Response, to Office Action U.S. Appl. No. 11/982,276, OA dated Dec. 7, 2009, Resp. filed Feb. 5, 2010.
Response to Office Action U.S. Appl. No. 11/982,276, OA dated Aug. 19, 2010, Resp. filed Nov. 2, 2010.
Response to Office Action U.S. Appl. No. 11/881,683, OA dated May 12, 2010, Resp. filed Aug. 3, 2010.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.
Office Action from Taiwan Patent Application No. 093128231 issued Apr. 21, 2011.
Second Office Action for counterpart Chinese Patent Application No. 200780050127.2 dated Jun. 15, 2011.
International Preliminary Examination Report for counterpart PCT Application No. PCT/US07/24366 mailed Jun. 29, 2011.
International Preliminary Examination Report for counterpart PCT Application No. PCT/US07/24367 mailed Jun. 29, 2011.
Decision to Refuse a European Patent Application regarding counterpart application No. EP 05 808 825.3 dated Jun. 14, 2011.
Office Action U.S. Appl. No. 12/008,477, mailed Apr. 12, 2011.
Response to Office Action U.S. Appl. No. 12/008,477, filed Jun. 27, 2011.
Office Action U.S. Appl. No. 12/506,989, mailed on Jul. 20, 2011.
Response to Office Action U.S. Appl. No. 12/506,989, filed Nov. 21, 2011.
Office Action U.S. Appl. No. 12/287,764, mailed Jul. 30, 2010.
Response to Office Action U.S. Appl. No. 12/287,764, filed Nov. 30, 2010.
Office Action U.S. Appl. No. 11/956,989, mailed Apr. 16, 2010.
Response to Office Action U.S. Appl. No. 11/956,989, filed Jun. 14, 2010.
Response to Office Action U.S. Appl. No. 11/956,989, filed Jul. 14, 2010.
Office Action U.S. Appl. No. 12/287,764, mailed Mar. 25, 2010.
Response to Office Action U.S. Appl. No. 12/287,764, filed Jul. 21, 2010.
Office Action U.S. Appl. No. 12/287,764, mailed May 17, 2011.
Response to Office Action U.S. Appl. No. 12/287,764, filed Oct. 10, 2011.
Office Action U.S. Appl. No. 13/072,371, mailed Oct. 5, 2011.
Response to Office Action U.S. Appl. No. 13/072,371, filed Dec. 23, 2011.
Office Action U.S. Appl. No. 11/656,759, mailed Sep. 23, 2011.
Response to Office U.S. Appl. No. 11/656,759, filed Jan. 16, 2012.
Office Action U.S. Appl. No. 12/008,477, mailed Sep. 19, 2011.
Response to Office Action U.S. Appl. No. 12/008,477, filed Jan. 25, 2012.
Office Action U.S. Appl. No. 12/862,640, mailed Aug. 19, 2011.
Response to Office Action U.S. Appl. No. 12/862,640, filed Feb. 21, 2012.
Office Action U.S. Appl. No. 12/287,764, mailed Oct. 26, 2011.
Response to Office Action U.S. Appl. No. 12/287,764, filed Mar. 6, 2012.
Office Action U.S. Appl. No. 12/506,989, mailed Dec. 27, 2011.
Office Action U.S. Appl. No. 12/862,640, mailed Mar. 9, 2012.
Office Action U.S. Appl. No. 12/287,764, mailed Jan. 13, 2011.
Response to Office Action U.S. Appl. No. 12/287,764, filed May 5, 2011.
Notification of the First Office Action for Chinese Patent Application No. CN 201110029365.3 mailed Jan. 4, 2012.
Examination Report for European Application No. 04 783 941.0-2203, dated Mar. 22, 2012.
Notification of First Office Action from Chinese Application No. 201010279016.21, dated Feb. 28, 2012.
Notification of the Third Office Action from Chinese Application No. 200780050127.2, dated Mar. 28, 2012.
Decision of Rejection from Japanese Application No. 2009-547218, dated Mar. 8, 2012.
Decision of Rejection from Japanese Application No. 2009-547219, dated Mar. 8, 2012.
Extended European Search Report Application No. 10012027.8-2203/2306526, Mar. 30, 2012.
Office Action for Taiwan Patent Application No. 094122646, Feb. 20, 2012.
Examination Report for European Application No. 08 171 399.2-2222, Mar. 26, 2012.
Response to Office Action from related U.S. Appl. No. 12/229,366, OA dated Feb. 28, 2012, response dated Apr. 27, 2012.
Office Action from related U.S. Appl. No. 12/229,366, dated Feb. 28, 2012.
Response to Office Action from related U.S. Appl. No. 12/229,366, OA dated Sep. 19, 2011, response dated Dec. 7, 2011.
Office Action from related U.S. Appl. No. 12/229,366, dated Sep. 19, 2011.
Response to Office Action from related U.S. Appl. No. 12/229,366, OA dated Mar. 16, 2011, response dated Jun. 16, 2011.
Office Action from related U.S. Appl. No. 12/229,366, dated Mar. 16, 2011.
Response to Office Action from related U.S. Appl. No. 12/229,366, OA dated Oct. 22, 2010, response dated Nov. 9, 2010.
Office Action from related U.S. Appl. No. 12/229,366, dated Oct. 22, 2010.
International Search Report and Written Opinion from Application No. PCT/US2011/001214, dated Mar. 21, 2012.
Notification of the First Office Action. Chinese Patent Application No. 201010279016.2, dated: Feb. 28, 2012.
Summons to attend oral proceedings pursuant to Rule 115(1) EPC from Patent Application No. 05808825.3-2203, dated Feb. 23, 2011.

(56) References Cited

OTHER PUBLICATIONS

Provision of the minutes in accordance with Rule 124(4) EPC from Patent Application No. 05 808 825.3-2203. dated Feb. 23, 2011.
Notification of Reasons for Rejection for Japanese Patent Appl. No. 2011-279356, dated Jan. 23, 2013.
Notice of Results of Re-Consideration Prior to Appeal from Korean Patent Application No. 10-2007-7008694, dated Sep. 21, 2012.
Rejection Decision for Chinese Patent Application No. 201110029365.3, dated Sep. 10, 2012.
Noting of Loss of Rights from European Application No. 04783941. 0-2203/1665361, dated Nov. 6, 2012.
Official Action from European Patent Application No. 07874432.3, dated Nov. 13, 2012.
Official Action from European Patent Application No. 07840092.6, dated Nov. 13, 2012.
Rejection Decision from Taiwanese Patent Appl. No. 094122646, dated Dec. 14, 2012.
Decision of Rejection from Japanese Patent Appl. No. 2008-317576, dated Dec. 18, 2012.
Decision of Rejection from Japanese Patent Appl. No. 2006-526964, dated Dec. 18. 2012.
Second Office Action from Chinese Patent Application No. 20101029016.2, dated Dec. 24, 2012.
Office Action from Japanese Office Action, Application No. 2011-224055, dated Feb. 7, 2013.
Rejection Decision from Chinese Patent Appl. No. 201010279016.2, dated Jun. 21, 2013.
Interrogation from Japanese Patent Appl. No. 2008-317576, dated Jul. 9, 2013.
Interrogation from Japanese Patent Appl. No 2008-317576. dated Jul. 9, 2013.
Decision of Final Rejection from Japanese Patent Appl. No. 2011-224055, dated Jul. 26, 2013.
Decision of Rejection from Japanese Patent appl. No. 2011-279356, dated Jul. 31, 2013.
Notice of Rejection from Japanese Patent Appl. No. 2008-527912, dated Jun. 5, 2013.
Notice of Rejection from Japanese Patent Appl. No. 2008-527912 issued Jun. 14, 2011.
International Preliminary Report on Patentability from Appl. No. PCT/US06/24884 dated: Jun. 12, 2008.
Nichia Corp. White LED, Part No. NSPW312BX, "Specification for Nichia White LED, Model NSW312BS", pp. 1-14, 2004.
Nichia Corp. White LED, Part No. NSPW300BS, Specifications for Nichia White LED, Model NSFW300BS, pp. 1-14, 2004.
Office Action from Japanese Patent Appl. No. 2007-216808, mailed Sep. 6, 2010.
Office Action from Japanese Patent Appl. No. 2011-224055, Jan. 12, 2012.
Decision of Final Rejection from Japanese Patent Appl. No. 2007-216808, dated Jan. 1, 2011.
Office Action from German Patent Appl. No 10 2007 040 841.4-33, dated Sep. 17, 2009.
Office Action from German Patent Appl. No. 10 2007 040 811.2, dated Sep. 17, 2009.
Office Action from Chinese Patent Appl. No. 20070148326.9, dated Jun. 19, 2009, 2 pages.
Schubert, "Light-Emitting Diodes", Cambridge University Press, 2003, pp. 92-96.
Office Action U.S. Appl. No. 13/072,371, mailed Mar. 29, 2012.
Response to OA from U.S. Appl. No. 11/656,759. filed Jun. 26, 2012.
Office Action from U.S. Appl. No. 12/662,640, dated Jun. 29, 2012.
Office Action from U.S. Appl. No. 13/072,371, dated Mar. 29, 2012.
Response to OA from U.S. Appl. No. 13/072,371, filed May 16, 2012.
Office Action from U.S. Appl. No. 11/656,759, dated May 1, 2012.
Response to OA from U.S. Appl. No. 11/656,759, filed Jun. 26, 2012.
Office Action from U.S. Appl. No. 12/862,640, dated Jun. 29, 2012.
Response to OA from U.S. Appl. No. 12/862,640, filed Sep. 20, 2012.
Office Action from U.S. Appl. No. 12/506,989, dated Jul. 6, 2012.
Response to OA from U.S. Appl. No. 12/506,989, filed Oct. 11, 2012.
Office Action from U.S. Appl. No. 13/072,371, dated Jul. 23, 2012.
Response to OA from U.S. Appl. No. 13/072,371, filed Oct. 17, 2012.
Office Action from U.S. Appl. No. 12/842,639, dated Aug. 14, 2012.
Response to OA from U.S. Appl. No. 12/842,639, filed Nov. 9, 2012.
Office Action from U.S. Appl. No. 12/862,640, dated Oct. 2, 2012.
Response to OA from U.S. Appl. No. 12/862,640, filed Apr. 17, 2013.
Office Action from U.S. Appl. No. 12/506,989, dated Oct. 24, 2012.
Response to OA from U.S. Appl. No. 12/506,989, filed Dec. 4, 2012.
Office Action from U.S. Appl. No. 12/506,989, dated Jan. 18, 2013.
Response to OA from U.S. Appl. No. 12/506,989, filed Apr. 18, 2013.
Office Action from U.S. Appl. No. 12/862,640, dated Jan. 24, 2013.
Office Action from U.S. Appl. No. 13/072,371, dated Jan. 30, 2013.
Response to OA from Appl. No. 13/072,371, filed Apr. 22, 2013.
Office Action from U.S. Appl. No. 11/656,759, dated Feb. 13, 2013.
Response to OA from U.S. Appl. No. 11/656,759, filed May 13, 2013.
Office Action from U.S. Appl. No. 11/656,759, dated Jul. 2, 2013.
Response to OA from U.S. Appl. No. 11/656,759, filed Aug. 21, 2013.
Office Action from U.S. Appl. No. 13/072,371, dated Apr. 30, 2013.
Office Action from U.S. Appl. No. 12/862,640, dated Apr. 30, 2013.
Office Action from U.S. Appl. No. 12/842,639, dated Mar. 7, 2013.
Response to OA from U.S. Appl. No. 12/842,639, filed Jun. 5, 2013.
Office Action from U.S. Appl. No. 12/506,989, dated Sep. 5, 2013.
Office Action from U.S. Appl. No. 12/008,477, dated Sep. 3, 2013.
Appeal Decision to Grant a Patent from Japanese Patent No. 2007-506279, dated Oct. 28, 2013.
Office Action from U.S. Appl. No. 13/072,371, dated Nov. 8, 2013.
Office Action from Korean Patent Appl. No. 10-2009-7017405, dated Oct. 23, 2013.
First Office Action and Search Report from Chinese Patent Application No. 201210030627.2, dated Dec. 3, 2012.
Notification of Reexamination from Chinese Patent Appl. No. 200780050127.2, dated Jun. 3, 2014.
Office Action and Search Report from Taiwan Patent Appl. No. 097110195, dated Jul. 18, 2014.
Notification of Allowance from Taiwan Patent Appl. No. 101130701, dated Jul. 15, 2014.
Translation of Office Action from Taiwanese Patent Appl. No. 096143968, dated Feb. 13, 2014.
Decision of Rejection from Japanese Patent appl. No. 2012-02326, dated Apr. 8, 2014.
First Office Action and Search Report from Chinese Patent Appl. No. 2012-10175686.9, dated: Mar. 31, 2014.
Office Action from U.S. Appl. No. 12/506,989, dated Feb. 19, 2014.
Decision of Rejection from Japanese Patent Appl. No. 2012-026327, dated Apr. 8, 2014.
Brief Summary of Rejection Decision from Chinese Patent Appl. No. 201010279016.2 dated Apr. 22, 2014.
Preliminary Report from Japanese Patent Appl. No. 2013-020955 dated Dec. 26. 2013 (received May 8, 2014).
Preliminary Report from Japanese Patent Appl. No. 2013-024242 dated Feb. 26, 2014 (received May 8, 2014.
Office Action from Korean Patent Appl. No 10-2009-7017407, dated Apr. 28, 2014.
Notification of Reexamination from Chinese Patent appl. No. 201110029365.3 dated May 7, 2014.
Office Action from U.S. Appl. No. 13/429,053, dated Apr. 11, 2014.
Office Action from U.S. Appl. No. 12/008,477, dated Apr. 25, 2014.
Response to OA from U.S. Appl. No. 12/008,477, filed May 27, 2014.
Office Action from U.S. Appl. No. 13/072,371, dated Apr. 29, 2014.
Office Action from U.S. Appl. No. 11/656,759, dated May 27, 2014.
Office Action from Taiwanese Patent Appl. No. 097110195, dated Sep. 9, 2014.
Board Decision from Chinese Patent Appl. No. 201110029365.3, dated Aug. 13, 2014.
Second Office Action from Chinese Patent Appl. No. 201210175686. 9, dated Sep. 3, 2014.
Office Action from U.S. Appl. No. 12/842,639, dated Aug. 6, 2014.
Office Action from U.S. Appl. No. 12/526,989, dated Aug. 8, 2014.
Office Action from U.S. Appl. No. 13/017,845, dated Sep. 11, 2014.
Office Action (Brief Description of) from Chinese Patent Appl. No. 201010279016.2, dated Jan. 10. 2014.

(56) References Cited

OTHER PUBLICATIONS

IPT's Decision from Korean Patent Appl. No. 10-2007-7008694, dated Dec. 24, 2013.
Office Action from U.S. Appl. No. 12/862.640, dated Dec. 20, 2013.
Office Action from U.S. Appl. No. 11/656,759, dated Nov. 18, 2013.
Notice of Allowance from Korean Patent Appl. No. 10-2009-7017405, dated: Feb. 18, 2014.
Search Report from Taiwanese Patent appl. No. 096143968, dated: Feb. 17, 2014.
Search Report from Taiwanese Patent Appl. No. 097110195, dated Mar. 12, 2014.
Examination from European Appl. No. 04 783 941.0-1552, dated Mar. 6, 2014.
Office Action and Search Report from Taiwanese Patent Appl. No. 101130701, dated Feb. 6, 2014.
Fourth Examination from European Patent Appl. No. 04 763 941.0-1552, dated Oct. 7, 2014.
Summons to attend oral proceedings from European Patent Appl. No. 411.52.106724/0, dated Sep. 9, 2014.
Letter regarding unfavorable decision on appeal from Japanese Appl. No. 2011-279356, dated Nov. 12, 2014.
Preliminary Examination Report from Japanese Appl. No. 2012-026326, dated Oct. 1, 2014.
Third Office Action from Chinese Appl. No. 201210175686.9, dated Dec. 11, 2014.
Office Action from U.S. Appl. No. 13/429,053, dated Sep. 22, 2014.
Office Action from U.S. Appl. No. 12/862,640, dated Oct. 17, 2014.
Office Action for Korean Patent Application No. 10-2007-7008694 mailed Aug. 7, 2011.
Notification of Reasons for Rejection for counterpart Japanese Patent Application No. 2009-547219 dated Sep. 16, 2011.
Notification of Reasons for Rejection for counterpart Japanese Patent Application No. 2009-547218 dated Sep. 16, 2011.
Notice of Rejection of Japanese Patent Application No. 2006-526964 issued Sep. 13, 2011.
Notice of Reasons for Rejection for Japanese Patent Application No. JP 2008-317576 dated Sep. 13, 2011.
Reexamination Decision from Chinese Patent Appl. No. 200780050127.2, dated Jan. 5, 2015.
Office Action from U.S. Appl. No. 14/209,652, dated Dec. 12, 2014.
Office Action from U.S. Appl. No. 12/506,989, dated Jan. 21, 2015.
Notice of Final Rejection from Korean Appl. No. 10-2009-7017407, dated Feb. 27. 2015.
Notice of Allowance from Taiwanese Appl. No. 096143968, dated Mar. 10. 2015.
Notification of re-examination from Chinese Appl. No. 201010279016.2, dated Jan, 9, 2015.
Summons to attend Oral Proceedings from European Appl. No. 08171399.2, dated Jan. 16, 2015.
Decision of Re-Examination from Chinese Appl. No. 201080001658,4, dated Dec. 29. 2014.

* cited by examiner

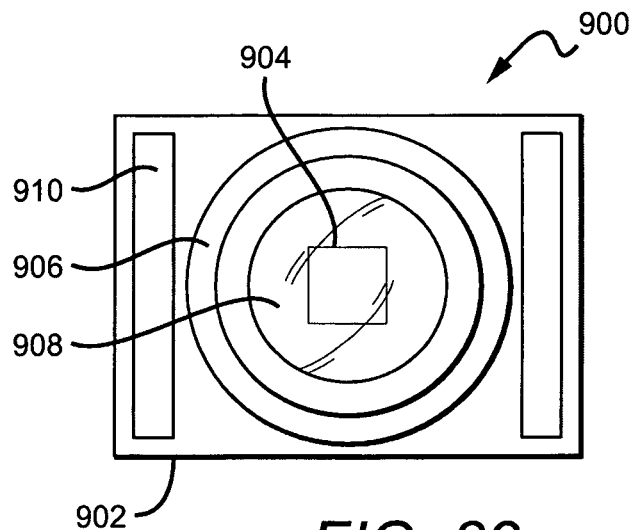
FIG. 33
FIG. 34
| CURRENT (mA) | LUMINOUS FLUX (lm) | EFFICACY (lm/W) |
|---|---|---|
| 350 | 98 | 86 |
| 700 | 167 | 72 |
FIG. 35
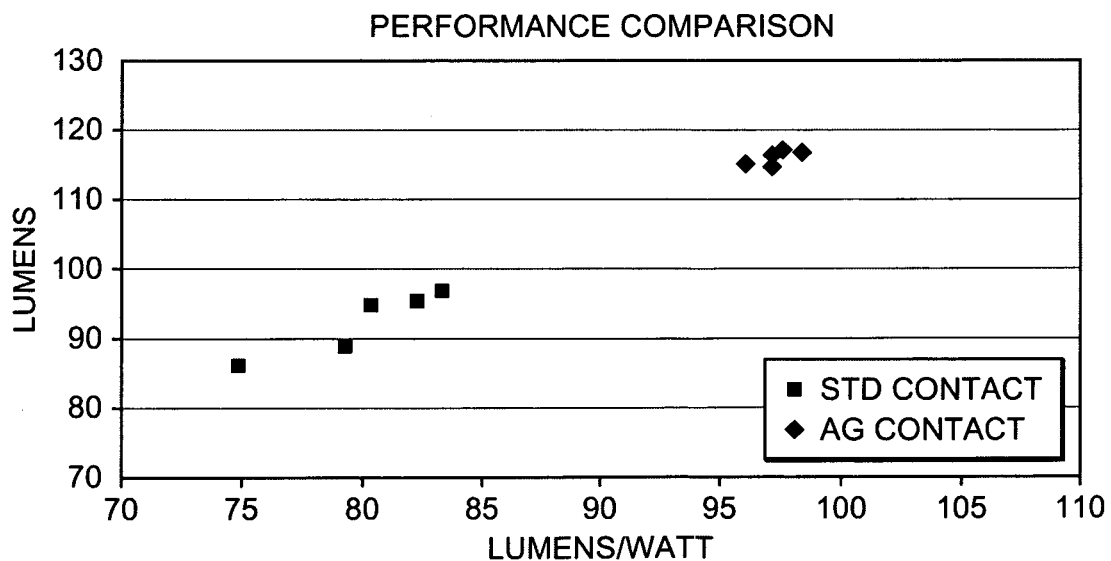

WAFER LEVEL PHOSPHOR COATING METHOD AND DEVICES FABRICATED UTILIZING METHOD

This application is a continuation-in-part of and claims the benefit of U.S. patent application Ser. No. 11/656,759 to Chitnis et al., filed on Jan. 22, 2007.

This invention was made with Government support under Contract USAF 05-2-5507. The Government has certain rights in this invention.

BACKGROUND OF THE INVENTION

1. Field of the Invention

This invention relates to methods for fabricating semiconductor devices and in particular methods for wafer level coating of light emitting diodes.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a phosphor mixed with epoxy resin or silicone polymers over the LED. Using this method, however, it can be difficult to control the phosphor layer's geometry and thickness. As a result, light emitting from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

With these approaches the key challenge is accessing the wire bond pad on the device after the coating process. Accessing the wire bond by standard wafer fabrication techniques is difficult with typical silicone binding material, as well as other binder materials such as epoxies or glass. Silicones are not compatible with commonly used wafer fabrication materials such as acetone, as well as some developers, and resist strippers. This can limit the options and choices for the particular silicones and process steps. Silicones are also cured at high temperature (greater than 150° C.), which is beyond the glass transition temperature of commonly used photoresists. Cured silicone films with phosphor are also difficult to etch and have a very slow etch rate in chlorine and $CF_4$ plasma, and wet etching of cured silicones is typically inefficient.

SUMMARY OF THE INVENTION

The present invention discloses new methods for fabricating semiconductor devices such as LED chips at the wafer level, and discloses LED chips and LED chip wafers fabricated using the methods. One method for fabricating light emitting diode (LED) chips according to the present invention comprises providing a plurality of LEDs typically on a substrate. Pedestals are formed on the LEDs with each of the pedestals in electrical contact with one of the LEDs. A coating is formed over said LEDs, with the coating burying at least some of the pedestals. The coating is then planarized leaving some of said coating material on said LEDs while exposing at least some of the buried pedestals, making them available for contacting. The present invention discloses similar methods used for fabricating LED chips comprising LEDs flip chip mounted on a carrier substrate. Similar methods according to the present invention can also be used for fabricating other semiconductor devices.

One embodiment of a light emitting diode (LED) chip wafer fabricated using methods according to the present invention comprises a plurality of LEDs on a substrate wafer and a plurality of pedestals, each of which is in electrical contact with one of the LEDs. A coating at least partially covers the LEDs with at least some of the pedestals extending through and to the surface of the coating. The pedestals are exposed at the surface of the coating.

One embodiment of a light emitting diode (LED) chip manufactured using methods according to the present invention comprises an LED on a substrate and a pedestal in electrical contact with the LED. A coating at least partially covering the LED, with the pedestal extending through and to the surface of the coating and exposed at the surface of the coating.

In accordance with certain aspects of the present invention, the coating can include phosphor particles that downconvert at least some of the light emitted from the active region of the LED chip to produce white light, thereby producing a white LED chip.

These and other aspects and advantages of the invention will become apparent from the following detailed description and the accompanying drawings which illustrate by way of example the features of the invention.

BRIEF DESCRIPTION OF THE DRAWINGS

FIG. 33 is a top view of the LED package in FIG. 32;

FIG. 34 is a table showing performance characteristics for an LED package according to the present invention; and FIG. 35 is graph showing performance characteristics for different LED packages according to the present invention.

DETAILED DESCRIPTION OF THE INVENTION

Figure 1A:
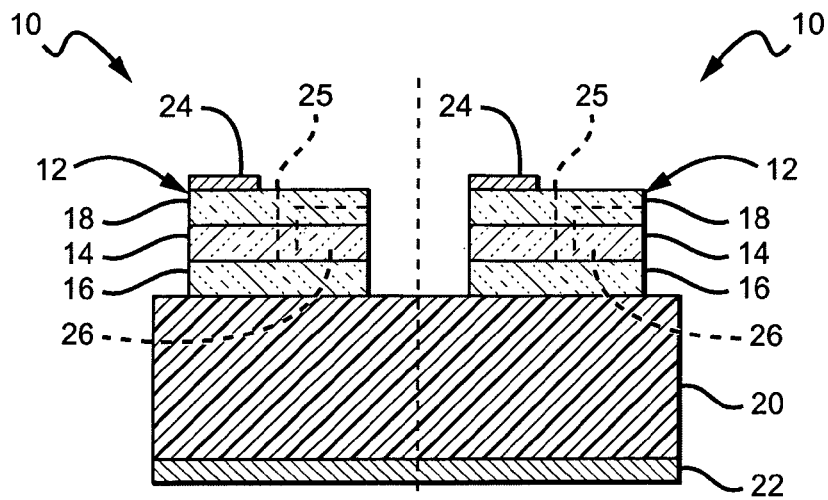
FIGS. 1a through 1e are sectional views of one embodiment of an LED chip wafer at fabrication steps in one method according to the present invention.

The present invention provides fabrication methods that are particularly applicable to wafer level coating of semiconductor devices such as LEDs. The present invention also provides semiconductor devices, such as LEDs fabricated using these methods. The present invention allows coating of LEDs at the wafer level with a down-converter layer (e.g. phosphor loaded silicone) while still allowing access to one or more of the contacts for wire bonding. According to one aspect of the present invention, electrically conducting pedestals/posts are formed on one or both of the LED contacts (bond pads) while the LEDs are at the wafer level. These pedestals can be fabricated using known techniques such as electroplating, electroless plating, stud bumping, or vacuum deposition. The wafer can then be blanket coated with a down-converter coating layer, burying the LEDs, contacts and pedestals. Each of the pedestals act as a vertical extension of its contact, and although the blanket coating with the down-converter coating temporarily covers the pedestals, the coating can be planarized and thinned to expose the top surface or top portion of the pedestals. The pedestals should be tall enough (10-100 μm) to project through the desired final coating thickness. After planarizing the pedestals are exposed for external connection such as by wire bonding. This process occurs at the wafer level and at a subsequent fabrication step, the individual LEDs chips can be separated/singulated from the wafer using known processes.

The present invention eliminates complex wafer fabrication processes to access wire bond pads after blanket coating. Instead a simple and cost effective approach is utilized. It allows for wafer level coating of semiconductor devices without the need for alignment. A wide variety of coating technologies can be used such as spin-coating of phosphor loaded silicone mixture, or electrophoretic deposition of phosphor followed by blanket coating of silicone or other binding material. Mechanical planarization allows thickness uniformity over the wafer and thickness uniformity of the coat can be achieved over a wide thickness range (e.g. 1 to 100 µm). White LED chip color point may be fine tuned by controlling the final coat thickness, including using an iterative approach (e.g. grind, test, grind, etc.) which will result in tightly binned white LEDs. This approach is also scalable to large wafer sizes.

The present invention is described herein with reference to certain embodiments but it is understood that the invention can be embodied in many different forms and should not be construed as limited to the embodiments set forth herein. In particular, the present invention is described below in regards to coating LEDs with a down-converter coating that typically comprises a phosphor loaded binder ("phosphor/binder coating"), but it is understood that the present invention can be used to coat LEDs with other materials for down-conversion, protection, light extraction or scattering. It is also understood that the phosphor binder can have scattering or light extraction particles or materials, and that the coating can be electrically active. The methods according to the present invention can also be used for coating other semiconductor devices with different materials. Additionally, single or multiple coatings and/or layers can be formed on the LEDs. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 1B:
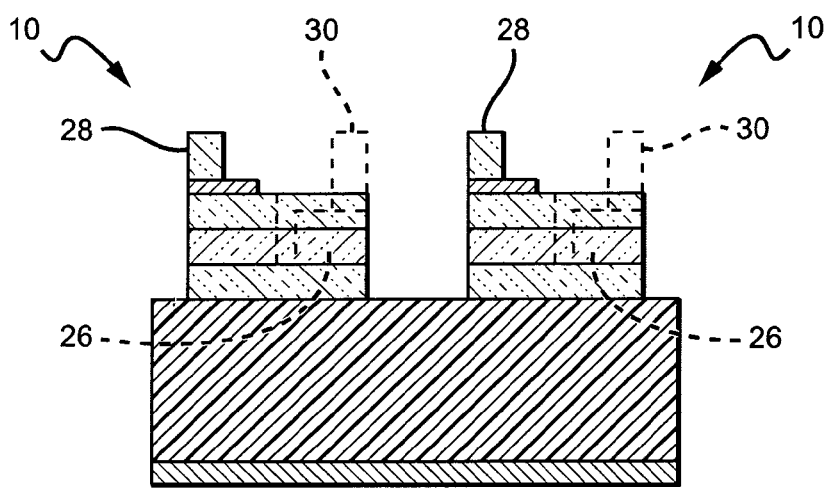
Figure 1C:
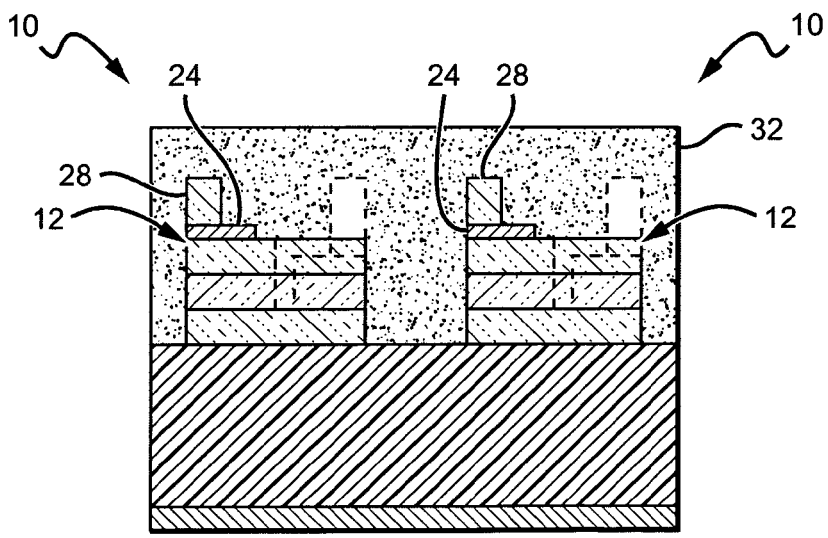
Figure 1D:
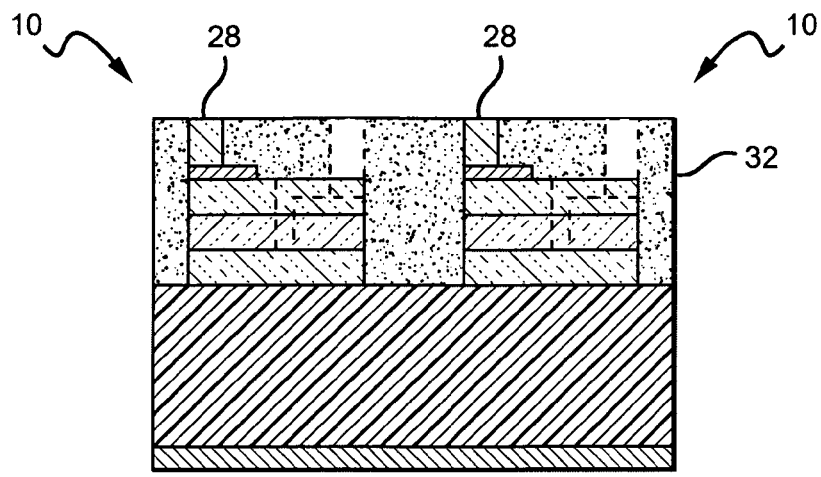
Figure 1E:
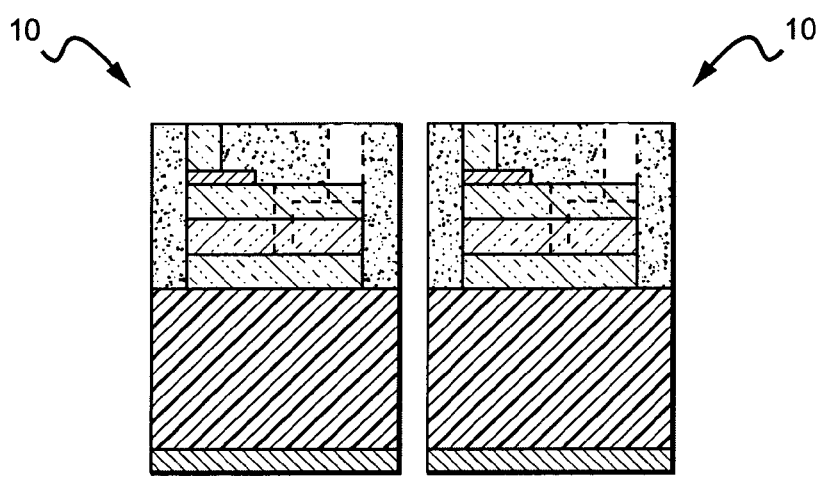

FIGS. 1a through 1e show one embodiment of wafer level LED chips 10 manufactured using a method according to the present invention. Referring now to FIG. 1a, the LEDs chips 10 are shown at a wafer level of their fabrication process. That is, the LEDs chips 10 have not been through all the steps necessary before being separated/singulated from wafer into individual LED chips. Phantom lines are included to show separation or dicing line between the LED chips 10 and following additional fabrication steps, and as shown in FIG. 1e the LEDs chips can be separated into individual devices. FIGS. 1a through 1e also show only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 10 comprises a semiconductor LED 12 that can have many different semiconductor layers arranged in different ways. The fabrication and operation of LEDs is generally known in the art and only briefly discussed herein. The layers of the LED 10 can be fabricated using known processes with a suitable process being fabrication using metal organic chemical vapor deposition (MOCVD). The layers of the LEDs 12 generally comprise an active layer/region 14 sandwiched between first and second oppositely doped epitaxial layers 16, 18, all of which are formed successively on a substrate 20. In this embodiment the LEDs 12 are shown as separate devices on the substrate 20. This separation can be achieved by having portions of the active region 14 and doped layers 16, 18 etched down to the substrate 20 to form the open areas between the LEDs 12. In other embodiments and as described in more detail below, the active layer 14 and doped layers 16, 18 can remain continuous layers on the substrate 20 and can be separated into individual devices when the LED chips are singulated.

It is understood that additional layers and elements can also be included in the LED 12, including but not limited to buffer, nucleation, contact and current spreading layers as well as light extraction layers and elements. The active region 14 can comprise single quantum well (SQW), multiple quantum well (MQW), double heterostructure or super lattice structures. In one embodiment, the first epitaxial layer 16 is an n-type doped layer and the second epitaxial layer 18 is a p-type doped layer, although in other embodiments the first layer 16 can be p-type doped and the second layer 18 n-type doped. The first and second epitaxial layers 16, 18 are hereinafter referred to as n-type and p-type layers, respectively.

The region 14 and layers 16, 18 of the LEDs 12 may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers 16, 18 are gallium nitride (GaN) and the active region 14 is InGaN. In alternative embodiments the n- and p-type layers 16, 18 may be AlGaN, aluminum gallium arsenide (AlGaAs) or aluminum gallium indium arsenide phosphide (AlGaInAsP).

The substrate 20 can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In the embodiment shown, the substrate 20 is at the wafer level, with the plurality of LEDs 12 formed on the wafer substrate 20.

Each of the LEDs 12 can have first and second contacts 22, 24. In the embodiment shown, the LEDs have a vertical geometry with the first contact 22 on the substrate 20 and the second contact 24 on the p-type layer 18. The first contact 22 is shown as one layer on the substrate, but when the LED chips are singulated from the wafer the first contact 22 will also be separated such that each LED chip 10 has its own portion of the first contact 22. An electrical signal applied to the first contact 22 spreads into the n-type layer 16 and a signal applied to the second contact 24 spreads into the p-type layer 18. The first and second contacts can comprise many different materials such as Au, copper (Cu) nickel (Ni), indium (In), aluminum (Al), silver (Ag), or combinations thereof. In still other embodiments can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired optical and electrical characteristics such as transparency, junction resistivity and sheet resistance.

In the case of Group-III nitride devices, it is known that a thin semitransparent current spreading layer typically can cover some or all of the p-type layer 18. It is understood that the second contact 24 can include such a layer which is typically a metal such as platinum (Pt) or a transparent conductive oxide such as indium tin oxide (ITO), although other materials can also be used. The first and second contacts 22, 24 are hereinafter referred to as the n-type and p-type contacts respectively.

The present invention can also be used with LEDs having lateral geometry wherein both contacts are on the top of the LEDs. A portion of the p-type layer 18 and active region is removed, such as by etching to expose a contact mesa on the n-type layer 16. The boundary of the removed portion of the active region 14 and p-type layer 18 is designated by vertical phantom line 25. A second lateral n-type contact 26 (also shown in phantom) is provided on the mesa of the n-type layer 16. The contacts can comprise known materials deposited using known deposition techniques.

Referring now to FIG. 1b, and according to the present invention, a p-type contact pedestal 28 is formed on the p-type contact 24 that is utilized to make electrical contact to the p-type contact 24 after coating of the LEDs 12. The pedestal 28 can be formed of many different electrically conductive materials and can be formed using many different known physical or chemical deposition processes such as electroplating, mask deposition (e-beam, sputtering), electroless plating, or stud bumping, with the preferred contact pedestal being gold (Au) and formed using stud bumping. This method is typically the easiest and most cost effective approach. The pedestal 28 can be made of other conductive materials beyond Au, such as the metals utilized for the first and second contacts including Cu, Ni, In, or combinations thereof, or the conducting oxides and transparent conducting oxides listed above.

The process of forming stud bumps is generally known and only discussed briefly herein. Stud bumps are placed on the contacts (bond pads) through a modification of the "ball bonding" process used in conventional wire bonding. In ball bonding, the tip of the bond wire is melted to form a sphere. The wire bonding tool presses this sphere against the contact, applying mechanical force, heat, and/or ultrasonic energy to create a metallic connection. The wire bonding tool next extends the gold wire to the connection pad on the board, substrate, or lead frame, and makes a "stitch" bond to that pad, and finishes by breaking off the bond wire to begin another cycle. For stud bumping, the first ball bond is made as described, but the wire is then broken close above the ball. The resulting gold ball, or "stud bump" remains on the contact and provides a permanent, reliable connection through to the underlying contact metal. The stud bumps can then be flattened (or "coined") by mechanical pressure to provide a flatter top surface and more uniform bump heights, while at the same time pressing any remaining wire into the ball.

The height of the pedestal 28 can vary depending on the desired thickness of the phosphor loaded binder coating and should be high enough to match or extend above the top surface of the phosphor loaded binder coating from the LED. The height can exceed 200 μm, with typical pedestal height in the range of 20 to 60 μm. In some embodiments, more than one stud bump can be stacked to achieve the desired pedestal height. The stud bumps or other forms of the pedestal 28 can also have a reflecting layer or can be made of a reflective material to minimize optical losses.

For the vertical geometry type LEDs 12 shown, only one pedestal 28 is needed for the p-type contact 24. For alternative lateral geometry LEDs a second n-type pedestal 30 (shown in phantom) is formed on the lateral geometry n-type contact 26, typically of the same materials, to substantially the same height as the p-type pedestal 28, and formed using the same processes.

Referring now to FIG. 1c, the wafer is blanketed by a phosphor/binder coating 32 that covers each of the LEDs 12, and its contact 22, and has a thickness such that it covers/buries the pedestal 28. For lateral geometry devices, the contact 26 and pedestal 30 are also buried. The present invention provides the advantage of depositing the phosphor coating over the LEDs 12 at the wafer level without the need for alignment over particular devices or features. Instead, the entire wafer is covered, which provides for a simpler and more cost effective fabrication process. The phosphor/binder coating can be applied using different processes such as spin coating, dispensing, electrophoretic deposition, electrostatic deposition, printing, jet printing or screen printing. In other embodiments the coating 32 can be provided as a separately fabricated perform that can be bonded over each of the LEDs, with one embodiment of a perform application method described below and shown in FIGS. 7a to 7d.

In a preferred embodiment, the phosphor can be deposited over the wafer in a phosphor/binder mixture using spin coating. Spin coating is generally known in the art and generally comprises depositing the desired amount of binder and phosphor mixture at the center of the substrate and spinning the substrate at high speed. The centrifugal acceleration causes the mixture to spread to and eventually off the edge of the substrate. Final layer thickness and other properties depend on the nature of the mixture (viscosity, drying rate, percent phosphor, surface tension, etc.) and the parameters chosen for the spin process. For large wafers it may be useful to dispense the phosphor/binder mixture over the substrate before spinning the substrate at high speed.

In another embodiment, the phosphor is deposited on the wafer using known electrophoretic deposition methods. The wafer and its LEDs are exposed to a solution containing phosphor particles suspended in a liquid. An electrical signal is applied between the solution and the LEDs which creates an electrical field that causes the phosphor particles to migrate to and deposit on the LEDs. The process typically leaves the phosphor blanketed over the LEDs in powder form. A binder can then be deposited over the phosphor with the phosphor particles sinking into the binder to form the coating 32. The binder coating can be applied using many known methods and in one embodiment, the binder coating can be applied using spin coating.

The phosphor/binder coating 32 can then be cured using many different curing methods depending on different factors such as the type of binder used. Different curing methods include but are not limited to heat, ultraviolet (UV), infrared (IR) or air curing.

Different factors determine the amount of LED light that will be absorbed by the phosphor/binder coating in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Different materials can be used for the binder, with materials preferably being robust after curing and substantially transparent in the visible wavelength spectrum. Suitable material include silicones, epoxies, glass, inorganic glass, spin-on glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. In other embodiments, the binder material can be engineered to be index matched with the features such as the chip (semiconductor material) and growth substrate, which can reduce total internal reflection (TIR) and improve light extraction.

Many different phosphors can be used in the coating 32 according to the present invention. The present invention is particularly adapted to LED chips emitting white light. In one embodiment according to the present invention LEDs 12 emit light in the blue wavelength spectrum and the phosphor absorbs some of the blue light and re-emits yellow. The LED chips 10 emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

First and second phosphors can also be combined for higher CRI white of different white hue (warm white) with the yellow phosphors above combined with red phosphors. Different red phosphors can be used including:
$Sr_xCa_{1-x}S$:Eu, Y; Y=halide;
$CaSiAlN_3$:Eu; or
$Sr_{2-y}Ca_ySiO_4$:Eu Other phosphors can be used to create saturated color emission by converting substantially all light to a particular color. For example, the following phosphors can be used to generate green saturated light:
$SrGa_2S_4$:Eu;
$Sr_{2-y}Ba_ySiO_4$:Eu; or
$SrSi_2O_2N_2$:Eu.

The following lists some additional suitable phosphors used as conversion particles in an LED chips 10, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:Eu$^{2+}_{0.06}$
$(Ba_{1-x-y}Sr_xCa_y)SiO_4$:Eu
$Ba_2SiO_4$:Eu$^{2+}$ Red
$Lu_2O_3$:Eu$^{3+}$
$(Sr_{2-x}La_x)(Ce_{1-x}Eu_x)O_4$
$Sr_2Ce_{1-x}Eu O_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ Different sized phosphor particles can be used including but not limited to 10-100 nanometer (nm)-sized particles to 20-30 µm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 µm. In other embodiments, the coating 32 can comprise different types of phosphors or can comprise multiple phosphor coatings for monochromatic or polychromatic light sources.

The methods according to the present invention can be more effective at depositing different sized particles on an LED compared to conventional deposition processes such as EPD. In EPD deposition processes similarly sized phosphor particles may respond to the electric field in the solution and deposit on the LED. Particles having different sizes, and in particular larger sizes, may not react to the electric field in the same way and may not deposit. Utilizing the present method, different sized phosphors can be included in the coating as desired before it is applied such that the end coating can have the desired combination of smaller sizes to effectively scatter and mix the light, and larger sizes to efficiently convert the light.

The coating 32 can also have different concentrations or loading of phosphor materials in the binder, with a typical concentration being in range of 30-70% by weight. In one embodiment, the phosphor concentration is approximately 65% by weight, and is preferably uniformly dispersed throughout the binder. Still in other embodiments the coating can comprise multiple layers of different concentrations or types of phosphors, and the multiple layers can comprise different binder materials. In other embodiments one or more of the layers can be provided without phosphors with our more being substantially transparent to the LED light. As more fully described below, in some embodiments a first coat of clear silicone can be deposited followed by phosphor loaded layers.

As discussed above, the pedestal 28 (and pedestal 30 for lateral devices) are buried by the coating 32, which allows for the LED chips 10 to be coated without the need for alignment. After the initial coating of the LED chips, further processing is needed to expose the pedestal 28. Referring now the FIG. 1d, the coating 32 is thinned or planarized so that the pedestals 28 are exposed through the coating's top surface. Many different thinning processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The thinning process not only exposes the pedestals, but also allows for planarizing of the coating and for control of the final thickness of the coating over the LEDs. As mentioned above, the coating 32 can have many different thicknesses following planarization, with a range of thicknesses in one embodiment being 1 to 100 µm. In still another embodiment, the suitable range of thicknesses is 30 to 50 µm. In other embodiments, the thickness of the coating can be non-uniform across the wafer or across a single LED, such as to compensate for emission variations across the wafer.

Following planarization, the surface root mean squared roughness of the coating should be approximately 10 nm or less, although the surface can have other surface roughness measurements. In some embodiments the surface can be textured during planarization. In other embodiments, after planarization the coating or other surfaces, can be textured such as by laser texturing, mechanical shaping, etching (chemical or plasma), scratching or other processes, to enhance light extraction. Texturing results in surface features that are 0.1-5 µm tall or deep, and preferably 0.2-1 µm. In other embodiments, the surface of the LEDs 12 can also be textured or shaped for improved light extraction.

Referring now to FIG. 1e, the individual LED chips 10 can be singulated from the wafer using known methods such as dicing, scribe and breaking, or etching. The singulating process separates each of the LED chips 10 with each having substantially the same thickness of coating 32, and as a result, substantially the same amount of phosphor and emission characteristics. For wafers having LEDs emitting similar wavelengths of light, this allows for reliable and consistent fabrication of LED chips 10 having similar emission characteristics. Following singulation of the LED chips, a layer of coating remains on the side surfaces of the LED and LED light emitting from the side surfaces also passes through the coating and its phosphor particles. This results in conversion of at least some of the side emitting light, which can provide LED chips having more consistent light emitting characteristics at different viewing angles.

Following singulation, the LED chips can be mounted in a package, or to a submount or printed circuit board (PCB) without the need for further processing to add phosphor. In one embodiment the package/submount/PCB can have conventional package leads with the pedestals electrically connected to the leads. A conventional encapsulation can then surround the LED chip and electrical connections. In another embodiment, the LED chip can be enclosed by a hermetically sealed cover with an inert atmosphere surrounding the LED chip at or below atmospheric pressure.

It is understood that although the embodiments described above and below are described with reference to vertical and lateral geometry devices, other devices having different geometries can also be used. For example, devices having two bottom-side contacts and no pedestals can also be coated according to the present invention with electrical contact to these devices made in different ways, such as through the carrier substrate.

Figure 2A:
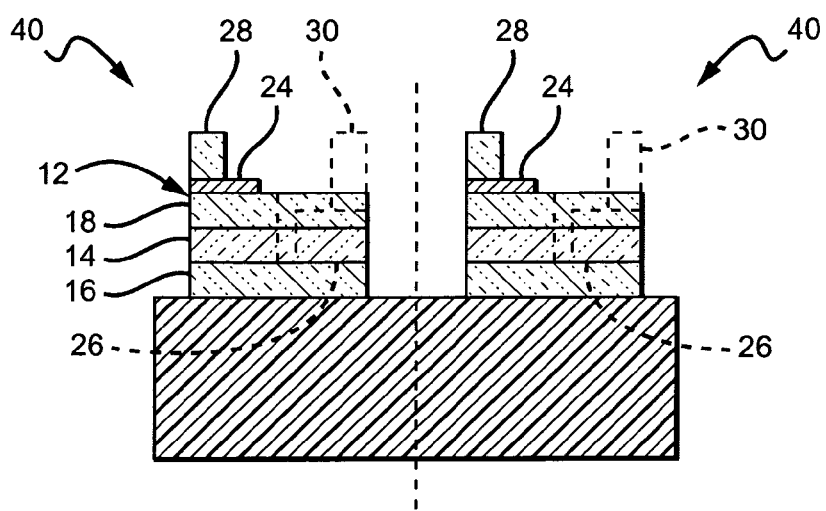
FIGS. 2a through 2g are sectional views of another embodiment of an LED chip wafer at fabrication steps in another method according to the present invention.
Figure 2B:
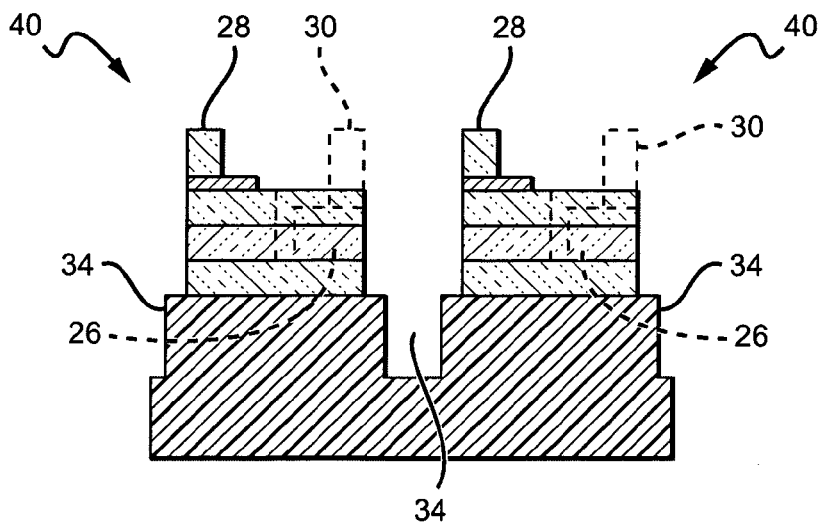

FIGS. 2a through 2f show another method for fabricating LED chips 40 according to the present invention and for similar features as those in LED chips 10 shown in FIGS. 1a through 1e, the same reference numbers will be used herein with the understanding that the description for these features above applies to the other embodiments using the same reference numbers. Referring to FIG. 2a, LED chips 40 are shown at a wafer level of their fabrication process and the LEDs chips 40 have not been through all the steps necessary before being separated/singulated from wafer into individual LED chips. Phantom lines are shown between the LED Chips to show the separation, singulation, or dicing line between the LED chips 40. Like the LED chips 10 described above and shown in FIGS. 1a through 1e, two devices are shown at the wafer level but it is understood that many more LED chips can be formed from a single wafer.

Each of the LED chips 40 comprises an LED 12 having an active layer/region 14 sandwiched between oppositely doped layers 16, 18, all of which are on substrate 20. The LEDs are shown as separate devices etched or mechanically cut down to the substrate 20 to form open areas between the LEDs 12, although as described above, the layers can be continuous with the individual devices separated during singulation. Different embodiments can have different spaces between adjacent LEDs following grinding, and in one embodiment the separation is approximately 50 micrometers (microns). It is further understood that additional layers can be included in the LED chips 40 and that this fabrication method can also be used with flip-chip LEDs provided on a carrier wafer.

Each of the LEDs 12 can have first and second contacts and for vertical geometry devices the second contact 24 can be on the second epitaxial layer 18. The first contact (not shown) is deposited on the substrate 20 at a later step in the present method, as shown in FIG. 2e and described below. For lateral geometry devices a second lateral n-type contact 26 (shown in phantom) is provided on the mesa of the n-type layer as described above. The contacts can comprise the materials described above in FIGS. 1a to 1e and can be deposited using known techniques.

A p-type contact pedestal 28 is formed on the second contact 24 and for lateral geometry devices, a second n-type contact pedestal 30 (shown in phantom) can be formed on the lateral geometry n-type contact 26. The p-type contact pedestal 28 and second n-type contact pedestal 30 are typically formed of the same materials and to substantially the same height using known processes. In alternative embodiments, however, the pedestals 28, 30 can be formed to different heights. It is understood that the pedestals 28, 30 can be made of the same materials as described above and can be formed at different points in this present method, such as after formation of the substrate grooves as described below.

The substrate 20 can have different thicknesses with one embodiment of the LED chips 10 having a substrate that is approximately 600 µm thick. Sawing or dicing through a substrate 20 of this thickness is challenging and time consuming both using blade sawing or laser sawing. Blade sawing can present a danger of substrate cracking, which can in turn result in a danger of the cracks spreading to and damaging the LEDs 12. Laser sawing such thick substrate would require multipass/multi level dicing or high power laser dicing or combination of both. Multi level dicing is time consuming while high power laser dicing leads to charring, which can adversely impact performance of the LED chip.

To reduce the danger of cracking and charring and to maintain the pace of fabrication, the substrate 20 can be partially cut from top using a laser, blade or other cutting method to form a pre-coat scribe, groove or trench ("groove"). In one embodiment, a blade is used when the cut passes partially through the substrate 20 forming a groove 34 between adjacent LEDs 12. Depending on the width of the blade the groove 34 can also have different widths, such as in the range of 15-25 µm. This groove reduces the thickness of the substrate 20 that must be sawed or diced to finally separate the LED chips 10, thereby reducing the danger of cracking. The trenches can have different depths and widths depending on the particular substrate thickness and materials for the substrate, as well as the cutting method. In one embodiment, the grooves have a depth in the range of 50 to 400 µm. In still another embodiment the grooves can have a depth in the range of 100-150 µm.

Figure 2C:
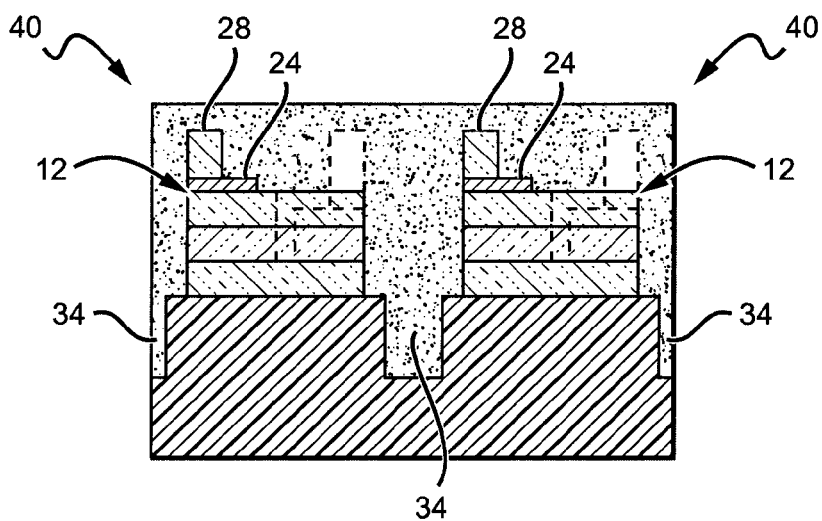
Figure 2D:
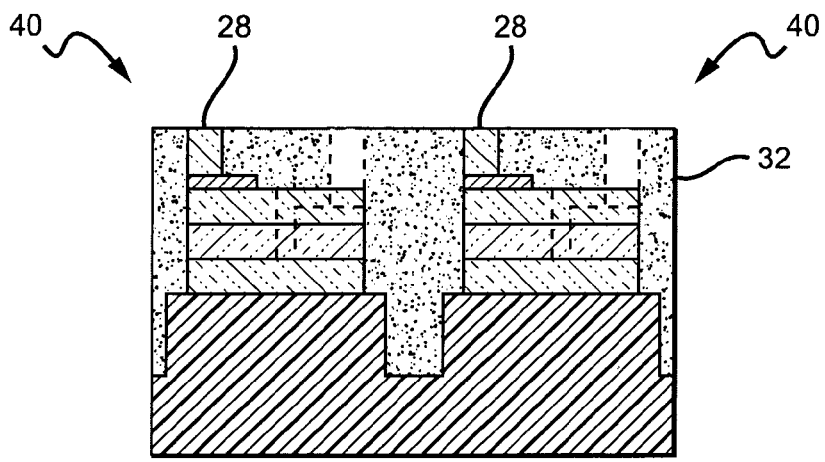
Figure 2E:
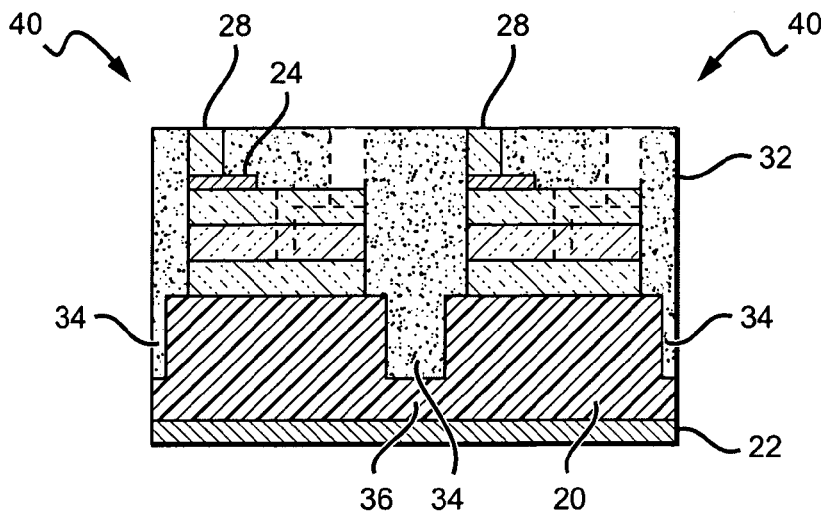

Referring now the FIG. 2c, the LEDs 12 can be covered by a phosphor/binder coating 32 that can be applied and cured using the methods described above, and can comprise the materials described above. The coating 32 can at least partially fill the grooves 34 such that the coating 32 passes below the top surface of the substrate 20. In the preferred embodiment the coating substantially fills the grooves 34. The pedestal 28 (and lateral pedestal 30) are buried by the coating 32, which allows for the LED chips 10 to be coated without the need for alignment. Following curing, additional processing is needed to expose the pedestals 28. Referring to FIG. 2d, the coating 32 can be thinned or planarized so that the pedestals 28 are exposed through the coating's top surface, using the methods described above. The coating over the LEDs 12 can have many different thicknesses such as in the range of 1 to 100 µm, and in one embodiment a suitable range of thicknesses is 30 to 50 µm.

Referring now to FIG. 2e, the substrate 20 can be thinned to provide the desired overall device height for particular end application, such as mounting the LED chip in an LED package. LED Chips according to the present embodiment can be mounted in many different LED packages such as the one described below and shown in FIGS. 31 and 32. For one LED package according to the present invention, the substrate 20 is thinned such that the overall height of the LED chip is in the range of 100 to 150 µm. It is understood, however, that the LED chips for other applications or packages can have different overall thicknesses. The substrate can be thinned using known methods such as mechanical grinding or chemical etching, leaving a relatively small stabilization portion 36 of the substrate 20 between the bottom of the trench 34 and the bottom surface of the substrate 20. The stabilization portion 36 maintains the integrity of the substrate (wafer) during subsequent processing steps and can have different thicknesses with some embodiments having thicknesses in the range of 10-30 µm.

Figure 2F:
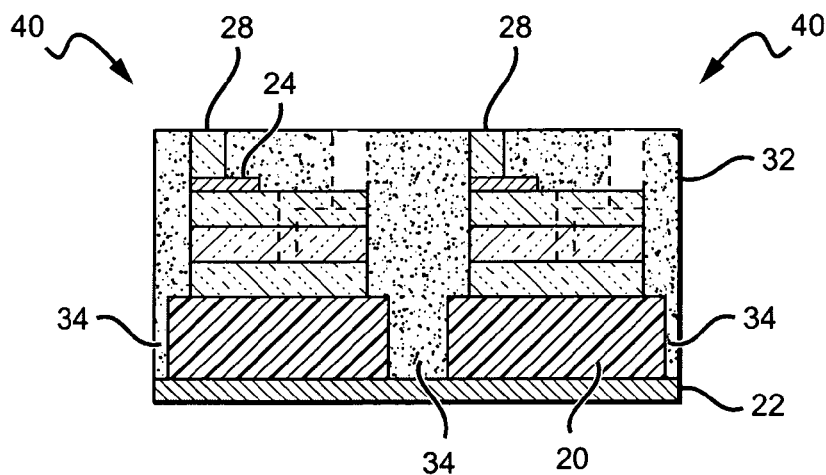

In still another embodiment shown in FIG. 2f, the substrate 20 can be thinned such that the bottom portion of the grooves are reached, leaving only a portion of the cured coating 32 between adjacent LED chips 40. In one such embodiment, the grooves 34 can have a depth of more than 100 µm and the substrate 20 can be thinned to 100 µm, reaching at least the bottom portion of the grooves 34. The overall thickness of the LED package can then have an overall thickness of approximately 130 µm.

Referring now to FIGS. 2e and 2f, for vertical geometry LEDs 12, a first contact 22 can be included as a layer of conductive material on the bottom surface of the thinned substrate 20, with the contact 22 being made of the same materials as those described above. When the LED chips 40 are singulated from the wafer each has a portion of the layer forming the first contact 22. An electrical signal applied across the first and second contacts 22, 24, to cause the LED 12 to emit light.

Figure 2G:
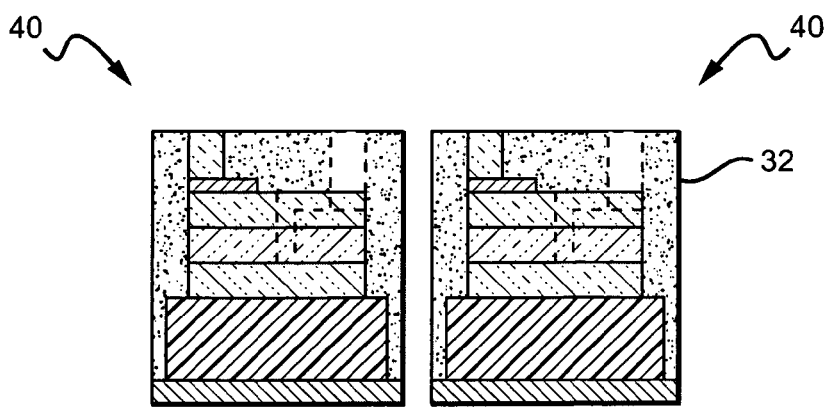

Referring now to FIG. 2g, the LED chips can be singulated from the wafer using known methods such as dicing, scribe and breaking, cleaving or etching. This generally comprises cutting through the coating 32 (and stabilizing portion 36 for FIG. 2e) either from the bottom or from the top through to separate the LED chips 40. In an alternative embodiment, the coating 32 (or stabilization portion 36 and coating 32 for embodiment in FIG. 2e) is partially cut from the bottom, and the remainder of the coating broken using known methods to separate the LED chips 40. In one embodiment the cut from the bottom reaches 30-40 micron before breaking, although it is understood that it could also reach different depths.

The singulated LED chips 40 can have a portion of the coating 32 remaining on at lease part of the sidewalls of the substrate 20. As more fully described below, this sidewall coating can enhance the uniform emission of the LED chips, particularly in the those embodiments where the substrate at least partially transmits LED light. The different cutting and breaking steps used in the methods according to the invention can result in angled surfaces on the LED chip, and in one embodiment the breaking of the coating 32 to singulate the LED chips 40 can leave lips or other irregularities in the coating 32.

Figure 3:
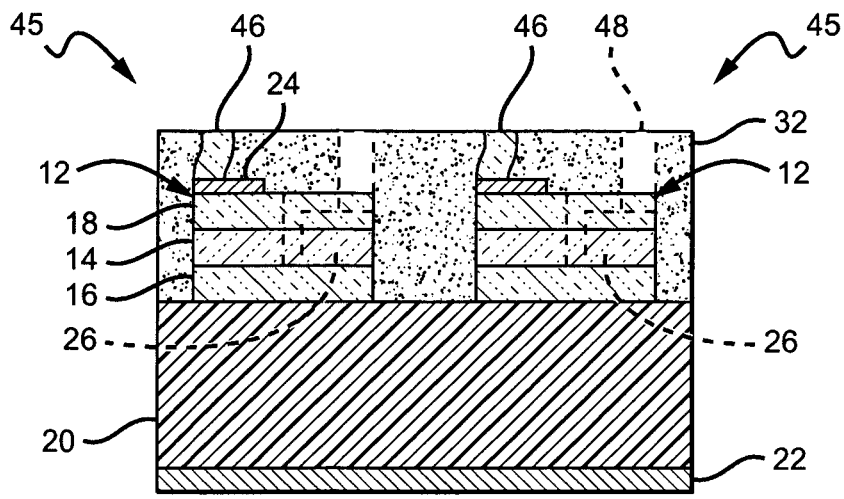
FIG. 3 is a sectional view of another embodiment of an LED chip wafer according to the present invention having microwire pedestals.

As mentioned above, the pedestals can be formed of many different electrically conductive materials and can be formed in many different ways. Preferred pedestals are capable of withstanding the coating application curing and planarization processes, while still providing a conductive path to their respective LED. FIG. 3 shows another embodiment of LED chips 45 according to the present invention similar to LED chips 10 described above, but having a different kind of pedestal. Each of the LED chips 45 comprises LEDs 12 formed on a substrate 20 and having n-type layer 16, active region 14 and p-type layer 18 formed successively on the substrate 20. LED chips 45 further comprise n-type contact 22, p-type contact 24, and coating 32. Pedestal 46 is included on the p-type contact 24 with the coating planarized to expose the top of the pedestal 46. In this embodiment, however, the pedestal 46 does not comprise stud bumps, but instead comprises a short wire or microwire. Different methods can be used for forming the microwire, with a suitable method being micro soldering to the p-type contact 24. The microwire can have different lengths and widths that allow it to withstand subsequent processing steps, with a suitable length being in the range of 5-500 µm and width being the range of 50-200 µm. The LED chips can then be singulated using different methods such as those described above. The LED chips 40 can alternatively have lateral geometry and can include a second lateral n-type contact 26 with a second microwire 48 (shown in phantom). The microwires 46, 48 can be made of many different conductive materials such as Au, Cu and other metals alone or in combination.

For the LED chips 10, 40 and 45 described above, light from the LED 12 that is emitted toward substrate 20 for transparent substrates can pass out of the LED chip through the substrate without passing through the phosphor/binder coating 32. This can be acceptable for generating certain colors or hues of light. In embodiments where this substrate emission or absorption is to be prevented or minimized, the substrate 20 can be opaque (such as Si) so that light from the LED 12 emitted toward the substrate 20 is blocked or absorbed so that most light emitting from the LED chip comes from light passing through the coating 32.

Figure 4:
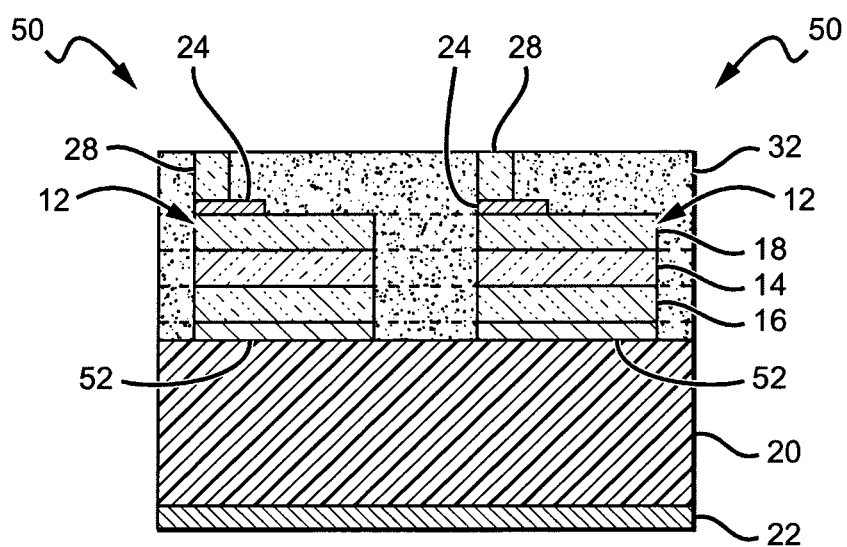
FIG. 4 is a sectional view of another embodiment of an LED chip wafer according to the present invention having a reflective layer.

FIG. 4 shows anther embodiment of LED chips 50 that are similar to the LED chips 10 described above and shown in FIGS. 1a through 1e, but having additional features to encourage emission of LED chip light toward the top of the LED chips 50 and to minimize light passing into the substrate 20. Each of the LED chips 50 comprises LEDs 12 formed on a substrate 20 and having n-type layer 16, active region 14 and p-type layer 18 formed successively on the substrate 20. LED chips 50 further comprise n-type contact 22, p-type contact 24, p-type pedestal 28 and coating 32. The coating 32 is planarized to expose the pedestal 28. The LED chips 50 can alternatively have lateral geometry with the additional pedestal as described above.

LED chips 50 can also comprise a reflective layer 52 that is arranged to reflect light emitted from the active region toward the substrate 20, back toward the top of the LED chips 50. This reflective layer 52 reduces the emission of light from the LEDs 12 that does not pass through conversion material before emitting from the LED chips 50, such as through the substrate 20 and encourages emission toward the top of the LED chips 50 and through the coating 32.

The reflective layer 52 can be arranged in different ways and in different locations in the LED chip 50, with the layer 52 as shown arranged between the n-type layer 16 and the substrate 20. The layer can also extend on the substrate 20 beyond the vertical edge of the LED chips 12. In other embodiments the reflective layer is only between the n-type layer 16 and the substrate. The layer 52 can comprise different materials including but not limited to a metal or a semiconductor reflector such as a distributed Bragg reflector (DBR). It is also understood that reflective layers can also be included in other locations on the LED chips 50, such as on the substrate 20.

In some embodiments the active region 14 and the n- and p-type layers 16, 18 can be continuous layers on the substrate 20 as shown by phantom lines between the LEDs 12. In these embodiments, the LEDs are not separated until the step when the LED chips 50 are singulated. Accordingly, the resulting LED chips may have a layer of the coating 32 only over the top surface of the LEDs, with the side surfaces being free of the coating following singulation. This can allow for emission of the active region light out the side surfaces of the LEDs 12, but in embodiments utilizing these LEDs in relation to the surrounding features, this emission of light without encountering phosphor material can be minimal compared to the amount of light passing through the phosphor material. In still other embodiments described below, the LED chips can comprise coating over the side surfaces to encourage conversion of light emitting from these surfaces.

Figure 5A:
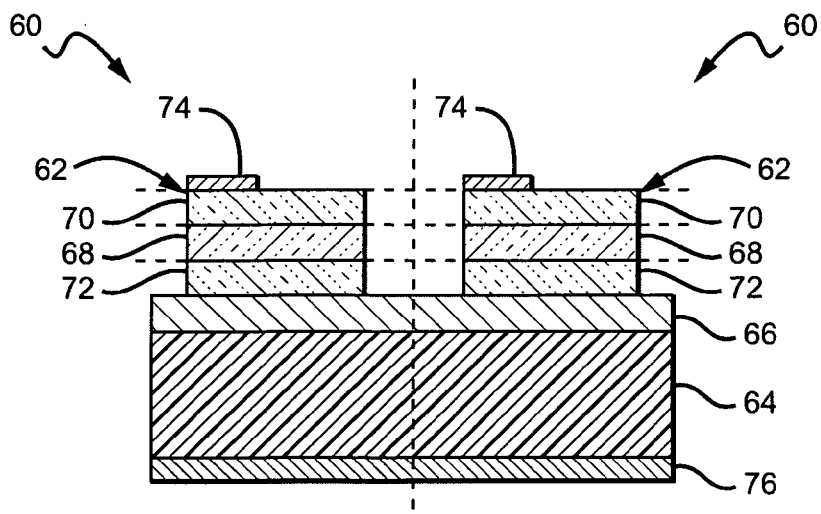
FIGS. 5a through 5e are sectional views of one embodiment of a flip-wafer bonded LED chip wafer at fabrication steps in another method according to the present invention.

The methods according to the present invention can be used to coat many different devices and LEDs. FIGS. 5a through 5e show a different LED chip 60 having a structure different from the LED chip 10 described above and shown in FIGS. 1a through 1e. Referring first to FIG. 5a, the LED chip 60 is also at wafer level and shown prior to singulating. It comprises LEDs 62 that are not on a growth substrate, but are instead flip-wafer bonded to a carrier substrate 64. In this embodiment, the growth substrate can comprise the materials described above for growth substrate 20 in FIGS. 1a through 1e, but in this embodiment the growth substrate is removed after (or before) flip-wafer bonding, with the substrate removed using known grinding and/or etching processes. The LEDs 62 are mounted to the carrier substrate 64 by layer 66, which is typically one or more bond/metal layers, and which also serve to reflect light incident on it. In other embodiments, the growth substrate or at least portions thereof remain. The growth substrate or the remaining portions can be shaped or textured to enhance light extraction from the LEDs 62.

Many different material systems can be used for the LEDs, with a preferred material system being the Group-III nitride material system grown using known processes as described above. Like the LEDs 12 in FIGS. 1a-1e each of the LEDs 62 generally comprises an active region 68 sandwiched between n-type and p-type epitaxial layers 70, 72 although other layers can also be included. Because LEDs 62 are flip-wafer bonded, the top layer is the n-type layer 70, while the p-type layer 72 is the bottom layer arranged between the active region 68 and the bond/metal layer 66. The carrier substrate can be many different known materials, with a suitable material being silicon.

For vertical geometry LED chips 60, an n-type contact 74 can be included on top surface of each of the LEDs, and a p-type contact 76 can be formed on the carrier substrate 64. The n- and p-type contacts 74, 76 can also be made of conventional conductive materials deposited using known techniques similar to the first and second contacts 22, 24 shown in FIGS. 1a through 1e and described above. As also described above, the LEDs can have a lateral geometry with the n- and p-type contacts on the top of the LEDs.

Figure 5B:
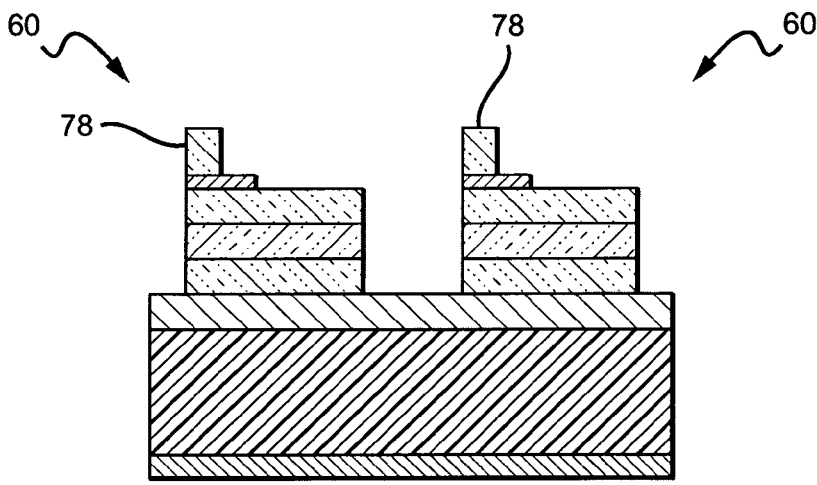
Figure 5C:
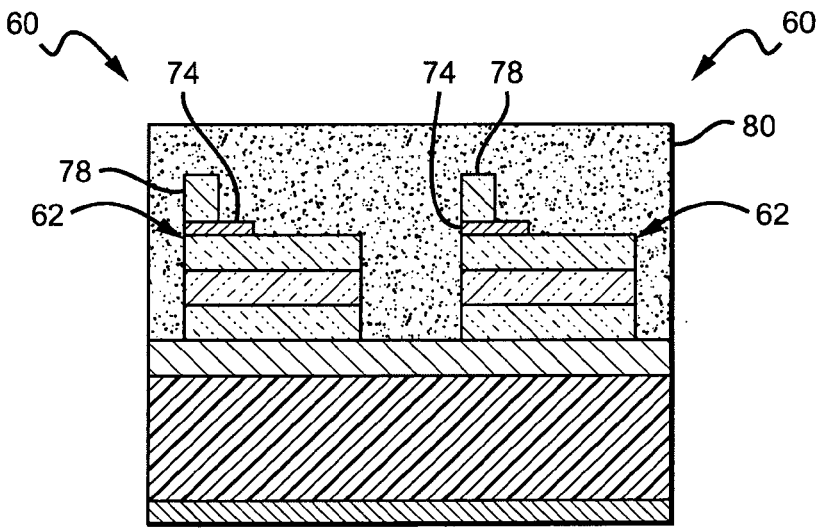

Referring now to FIG. 5b, each of the LED chips 60 can have a pedestal 78 formed on its first contact 70, with each pedestal being formed of the same material and using the same methods as those described above for pedestal 28 in FIGS. 1b through 1e. As shown in FIG. 5c the LED chip wafer can then be covered by a blanket coating 80 preferably comprising a phosphor loaded binder. The same phosphors and binder can be used as those for the coating 32 described above and shown in FIGS. 1c through 1e, and can be deposited using the same methods. The coating 80 covers and buries the LEDs 62, their first contacts 74 and the pedestals 78, with the coating 80 being deposited without alignment steps.

Figure 5D:
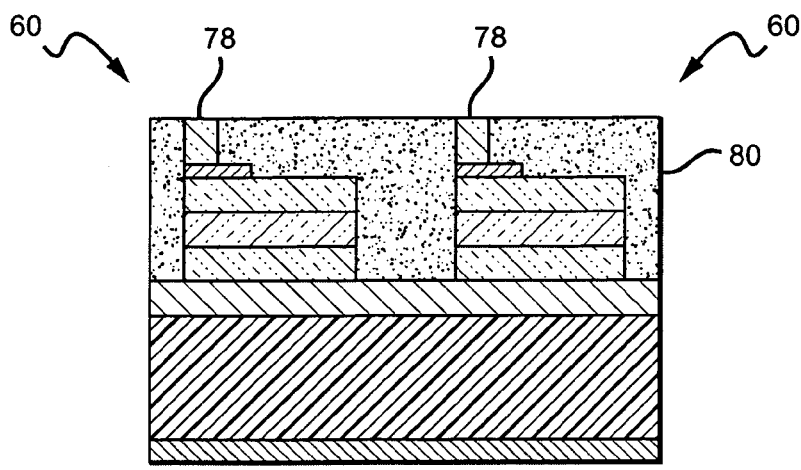
Figure 5E:
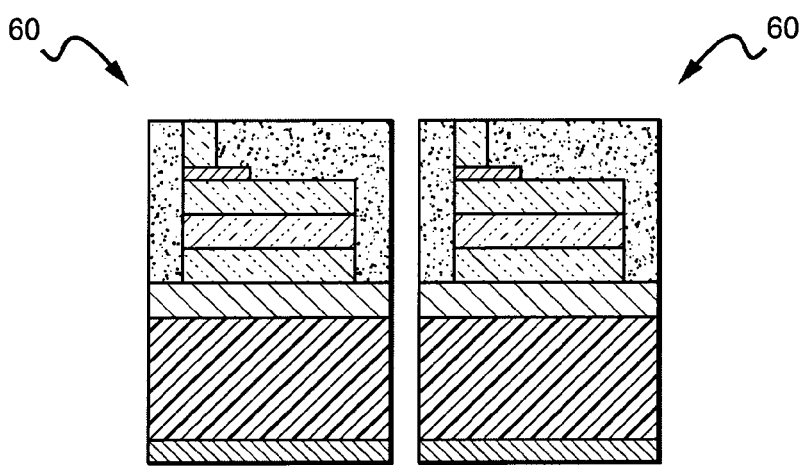

Referring now to FIG. 5d, the coating 80 can be planarized or thinned to expose the pedestals 78 and to control thickness of the coating 80 using the methods described above. Referring now to FIG. 5e, the individual LED chips 60 can be singulated from the wafer using the methods described above. These devices can then be packaged or mounted to a submount or PCB. In other embodiments the carrier substrate can be removed, leaving a coated LED that can then be packaged or mounted to a submount or PCB. It is further understood that the LED chips 60 can be similarly fabricated using the groove and substrate thinning method described above and shown in FIGS. 2a to 2f.

Figure 6:
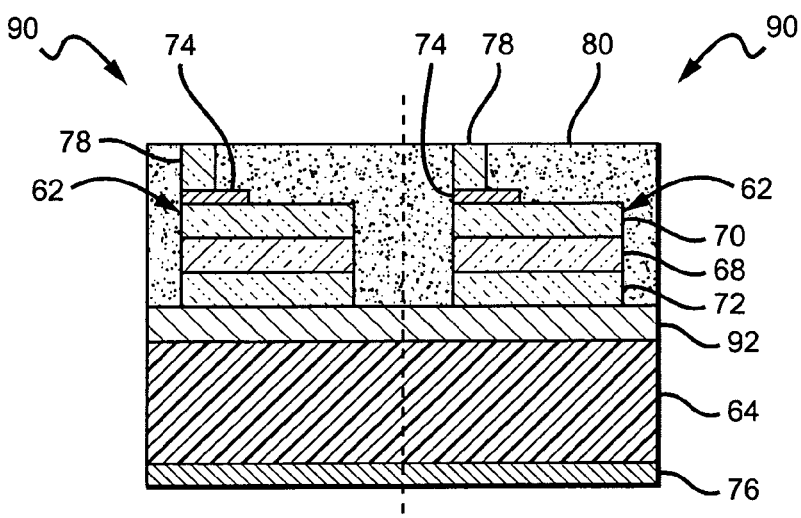
FIG. 6 is a sectional view of another embodiment of an LED chip wafer according to the present invention having a reflective layer.

The flip-wafer bonded LEDs can also have reflective elements or layers to encourage light emission in the desired direction. FIG. 6 shows LED chips 90 at the wafer level that are similar to the LED chips 60 shown in FIGS. 5a through 5f and described above. For similar features the same reference numbers are used herein, and although LED chips 90 are shown having vertical geometry LEDs 62, it is understood that lateral geometry LEDs can also be used. The LED chips 90 comprise LEDs 62 mounted to a substrate 64 that can either be a carrier or growth substrate. Each of the LEDs 62 comprises an active layer 68, n-type layer 70, p-type layer 72, p-type contact 76, n-type contact 74, and pedestal 78 as described above, and a phosphor loaded binder coating 80 is formed over the LEDs also as described above. In this embodiment, however, a reflective layer 92 is included between the LEDs 62 and the substrate 64 that can comprise a highly reflective metal or reflective semiconductor structures such as a DBR. The reflective layer 92 reflects LED light that is emitted toward the substrate 64 and helps prevent light from passing into the substrate where at least some of the light can be absorbed by the substrate 64. This also encourages light emission from the LED chips 90 toward the top of the LED chips 90. It is understood that a bond/metal layer (not shown) can also be included below the reflective layer or in other locations, particularly in the embodiments where the substrate 64 is a carrier substrate. The LED chips 90 can also comprise a p-contact layer adjacent to the p-type layer 72 to encourage ohmic contact to the layers below.

The methods described above can include many additional processing steps and can have steps completed in different order. The additional steps can comprise probing or testing of the LED chips at different points in the fabrication and tailoring the phosphor/binder coating thickness and/or composition to compliment the operating characteristics of the LEDs to reach the target operating characteristics of the LED chips.

Figure 7:
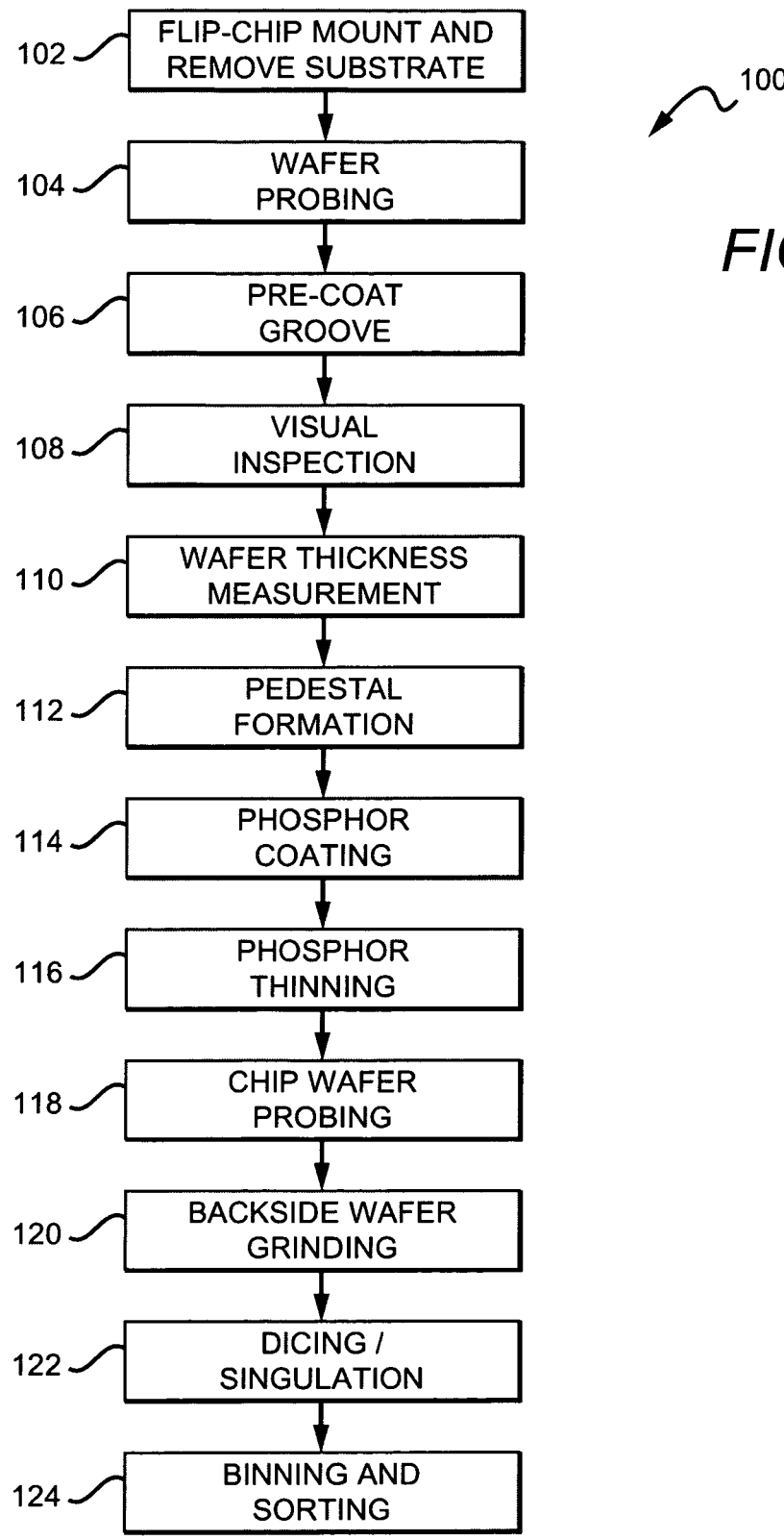
FIG. 7 is a flow diagram for one embodiment of a method according to the present invention for fabricating LED chips.

FIG. 7 is a flow diagram for one embodiment of method 100 according to the present invention incorporating many of the manufacturing steps described above, but also including additional steps for tailoring the phosphor/binder coating. The method 100 can be accomplished under computer control or with computer assistance. In 102, the LEDs are provided as continuous epitaxial layers on a growth substrate and flip-chip mounted on a carrier substrate with the growth substrate removed as described above and shown in FIGS. 5a to 5e. The LEDs can then be cut to form the individual devices on the carrier substrate. In an alternative embodiment the LEDs can be cut prior to flip-chip mounted on the carrier substrate with the growth substrate removed from the individual LEDs.

In 104 the wafer is probed using different methods such as electrical and optical testing. The resulting data can be provided to a computer where a map of the operating characteristics of the LEDs across the carrier wafer is generated. The map can include data regarding which of the LEDs meet certain operating criteria and which do not. The carrier wafer with its LEDs can then be binned depending on the operating characteristics of its LEDs. The appropriate phosphor or fluorescent material can be selected for the wafer based on the wavelength range to target a specific color point or color range. For example, the appropriate phosphor can be selected for blue emitting LEDs to target a specific white light color point or range.

In 106, a pre-coat trench or groove can be formed in the carrier substrate as described above and shown in FIG. 2b. In 108 the carrier wafer and its LEDs can be visual inspected for defects, with the results also being sent to a computer to merge with electrical/optical test data map. The resulting map can be utilized to generate a "good" die map showing that they meet the desired criteria. In 110 the thickness of the carrier wafer can also be measured with the results also being provided to the computer.

In 112, the pedestals are formed on the LEDs as described in the embodiments above (such as in FIGS. 1a and 1b) and can comprise for example stud bumps or microwires. It is understood that the appropriate contacts can also be deposited on the LEDs. The die map can be used so that pedestals are formed only on the "good" LEDs. Alternatively, the pedestals can be formed on all the LEDs.

In 114 the phosphor/binder coating can be formed on over and blanketing the LED chips using the methods described above (such an in FIG. 1c), and then cured. The appropriate phosphor material can be selected based on the characteristics of the LEDs on the carrier wafer and the desired color point for the LED chip. One or different phosphors, such as those listed above, can be used and can be applied using the methods described above.

In 116, the phosphor layer can be thinned using the methods describe above (such as in FIG. 1d) to expose the pedestals buried by the phosphor/binder coating. Based on the operating characteristics of the LEDs across the wafer and the properties of the phosphor (or fluorescent) material selected, the end thickness of the coating can be calculated to reach a desired color point/range and still expose the pedestals. In some embodiments determination of the appropriate thickness and the thinning can be automated under computer control.

In 118 the wafer can again be electrically and optically probed to determine color point for final binning with color and intensity. In 120, the backside of the carrier wafer can be thinned as described above and shown in FIG. 2e to achieve the desired thickness of the overall wafer. In step 122, the LED chips are singulated using the methods described above. In step 124 the individual LED chips are binned and sorted using the wafer level probe data.

It is understood that the methods according to the present invention can have different steps utilized to tailor the phosphor coating to achieve the desired characteristics for the end LED chip. The methods also have fewer or more steps than those described above and different steps can be utilized that can occur in different order.

Figure 8A:
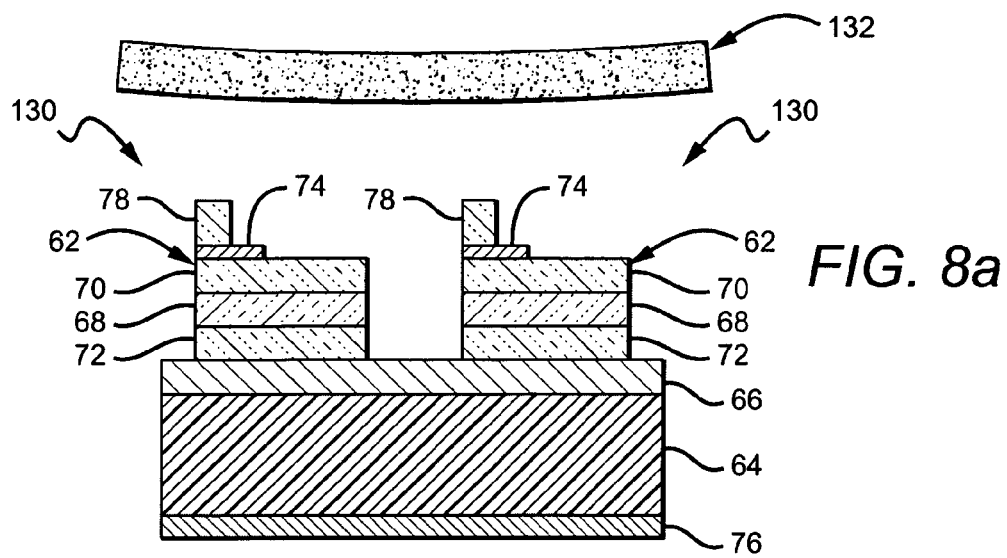
FIGS. 8a through 8d are sectional views of another embodiment of an LED chip wafer at fabrication steps in a method according to the present invention utilizing a prefabricated coating.

FIGS. 8a through 8d show another embodiment of LED chips 130 fabricated according to the present invention that are similar to the LED chips 60 described above and shown in FIGS. 5a through 5f. It is understood, however, that this method can also be used with non flip-wafer bonded embodiments such as the embodiment described above and shown in FIGS. 1a through 1e. Referring first to FIG. 8a, the LED chips 130 comprise vertical LEDs 62 mounted to a substrate 64 that in this case is a carrier substrate. It is understood that lateral LEDs can also be used as described above. Each of the LEDs 62 comprises active layer 68, n-type layer 70, p-type layer 72, p-type contact 76, n-type contact 74, and pedestal 78 as described above. For LED chips 130, however, are covered by a prefabricated or preformed coating layer 132 that can have the phosphor (and other) materials described above fixed in a binder also made of the materials described above.

Figure 8B:
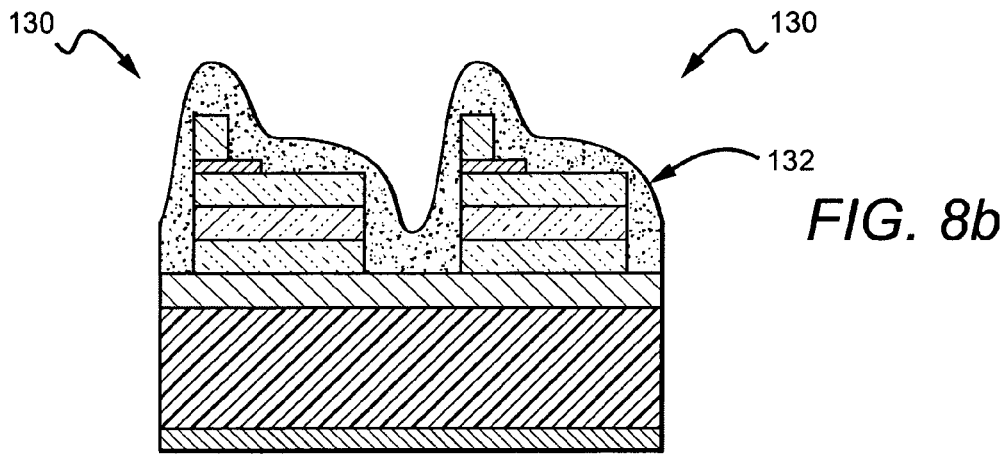

Referring now to FIG. 8b, the layer 132 is placed over and covering the LEDs 62 and their pedestals 78 to provide a conformal coating. In one embodiment a bonding material can be included between the layer 132 and the LED chips 130 for adhesion, with typical adhesives being used such as silicones or epoxies. To further encourage conformal coating, the layer 132 can be heated or a vacuum can be applied to pull the layer 132 down over the LED chips 130. The layer 132 can also be provided in a state where the binder is not fully cured so that the layer 132 more readily conforms to the LED chips. Following conformal placement of the layer 132, the binder can be exposed to its final curing.

Figure 8C:
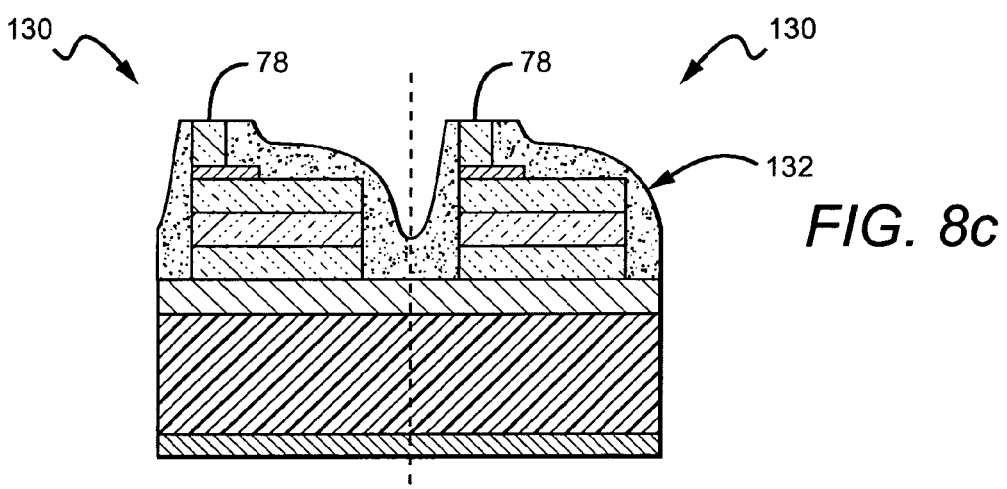
Figure 8D:
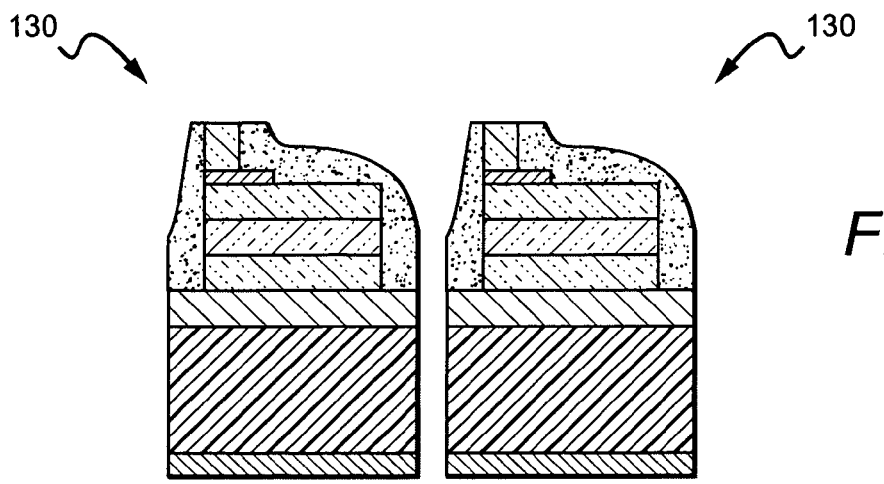

Referring now to FIG. 8c, the layer 132 can be planarized using the methods described above to expose the pedestals 78, making them available for contacting. As shown in FIG. 8d, the LED chips 130 can then be singulated using the methods described above, including the groove and substrate thinning method described above and shown in FIGS. 2a to 2f.

The fabrication method for LED chips 130 allows for the thickness of the phosphor/binder coating to be accurately controlled by controlling the thickness of the layer 132. This method also allows for the use of different layer thicknesses and composition for different desired emission characteristics for the LED chips 130. It is understood that in different embodiments more than one prefabricated or preformed layer can be utilized having different phosphors in different concentration and in different binder materials to achieve the desired LED chip emission color point.

Figure 9A:
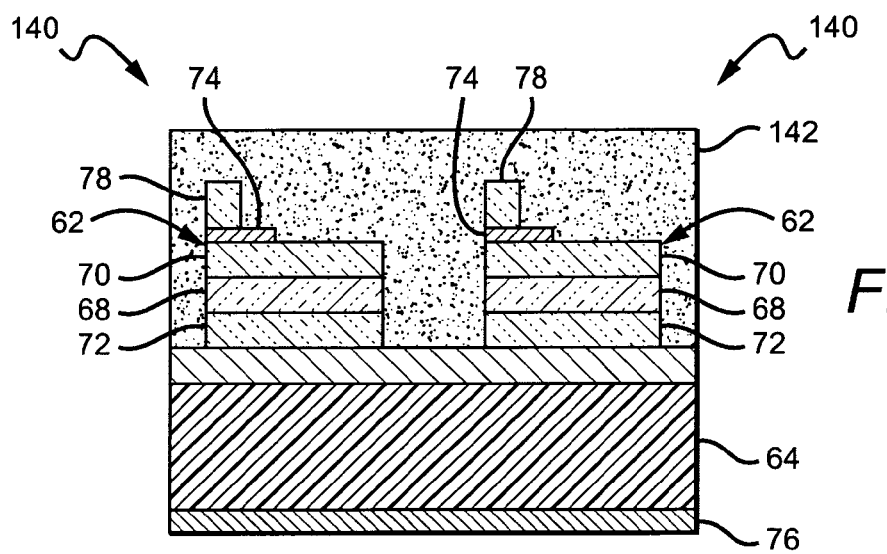
FIGS. 9a through 9c are sectional views of another embodiment of an LED chip wafer at fabrication steps in a method according to the present invention having recesses in the coating.
Figure 9B:
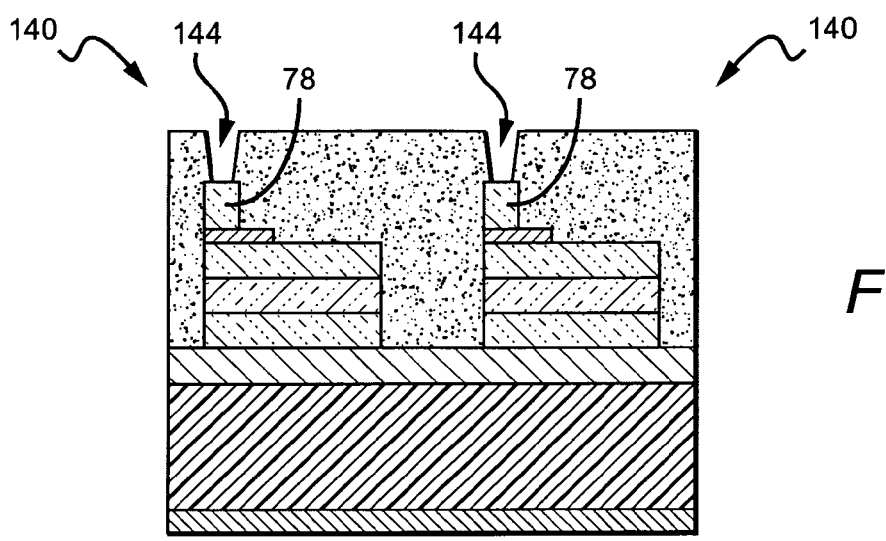
Figure 9C:
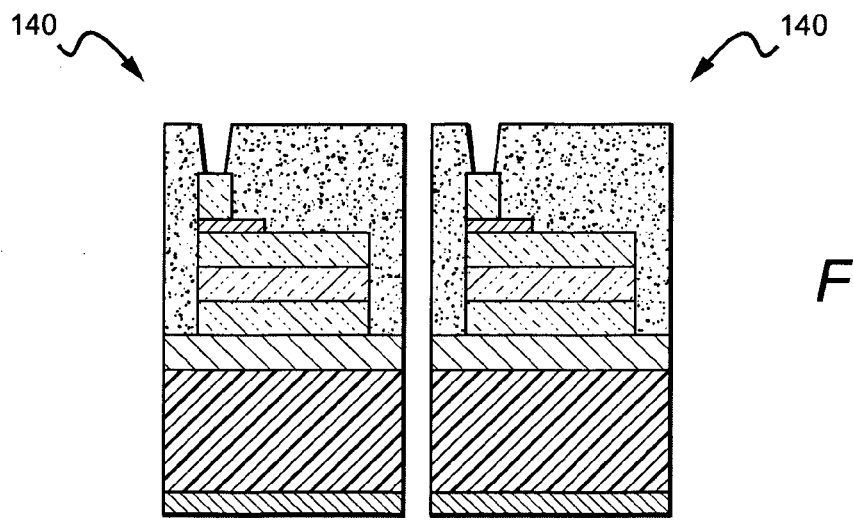

FIGS. 9a through 9c show still another embodiment of LED chips 140 according to the present invention similar to LED chips 60. Referring first to FIG. 9a, each of the LED chips 140 has vertical LEDs 62 mounted to a substrate 64 that can either be a carrier or growth substrate. Each of the LEDs 62 comprises active layer 68, n-type layer 70, p-type layer 72, p-type contact 76, n-type contact 74, and pedestal 78 as described above. A coating 142 made of the materials described above is included over the LEDs 62, burying the pedestals 78.

Referring to FIG. 9b, in this embodiment the coating 142 is not planarized to expose the pedestals 78. Instead, the coating remains at a level higher than the pedestals and a portion of the coating 142 burying the pedestal 78 is removed leaving recessed portions 144 in the coating 142. The pedestals 78 are exposed through the recessed portions 144 for contacting. Many different methods can be used to remove the coating such as conventional patterning or etching processes. Referring now to FIG. 9c, the LED chips 140 can then be singulated using the methods described above.

This method of forming recessed portions 144 can be used in conjunction with planarizing of the coating 142. The layer 142 can be planarized to the level that provides the desired emission characteristics of the LED chip 140, which may be above the pedestals 78. The recessed portions 144 can then be formed to access the pedestals. This allows for forming pedestals of reduced height lower than the coating, which can reduce fabrication costs related to forming the pedestals 78. This process can require some alignment with forming the recessed portions, but the coating 142 is still applied without the need for alignment.

Figure 10:
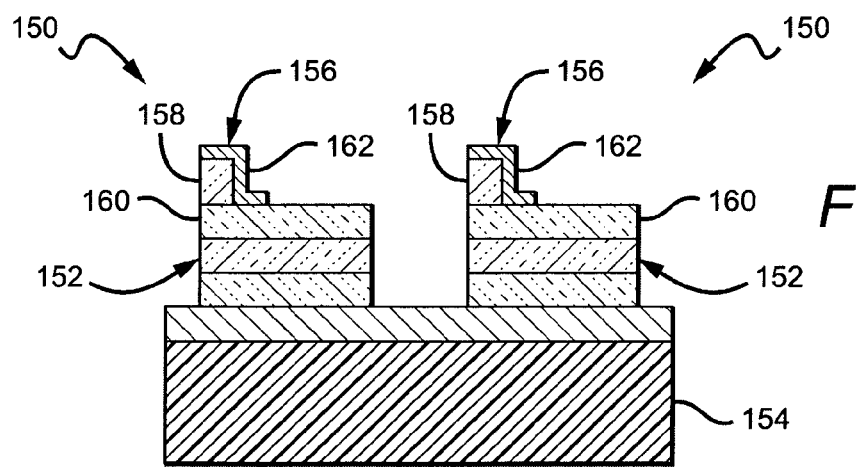
FIG. 10 is a sectional view of another embodiment of an LED chip wafer according to the present invention.

The pedestals in the LED chips embodiments above are described as comprising a conductive material such as Au, Cu, Ni or In, preferably formed using stud bumping processes. Alternatively, the pedestals can be made of different materials such as the conductive oxides and transparent conductive oxides described above and can be formed using different methods as described above. FIG. 10 shows another embodiment of LED chips 150 according to the present invention comprising LEDs 152 flip-wafer bonded on a carrier substrate 154. In this embodiment, the pedestal 156 comprises a semiconductor material 158 formed generally in the shape of a pedestal 156. The semiconductor material 158 can be on the first contact, or as shown can be on the first epitixial layer 160. A pedestal layer 162 of conductive material is included on the top surface of the semiconductor material 158 and extending to the top surface of the first epitaxial layer 160 and forming an n-type contact.

The semiconductor material 158 can be formed in many different ways and can comprise many different materials, such as the material comprising the LED epitaxial layers or the growth substrate material, e.g. GaN, SiC, sapphire, Si, etc. In one embodiment, the semiconductor material 158 can be etched from the epitaxial layers, and then coated with the pedestal layer 162. In other embodiments, portions of the growth substrate can remain on the epitaxial layers during removal of the growth substrate from the LEDs 152. The remaining growth substrate portions can then be covered by the pedestal layer 162.

Figure 11:
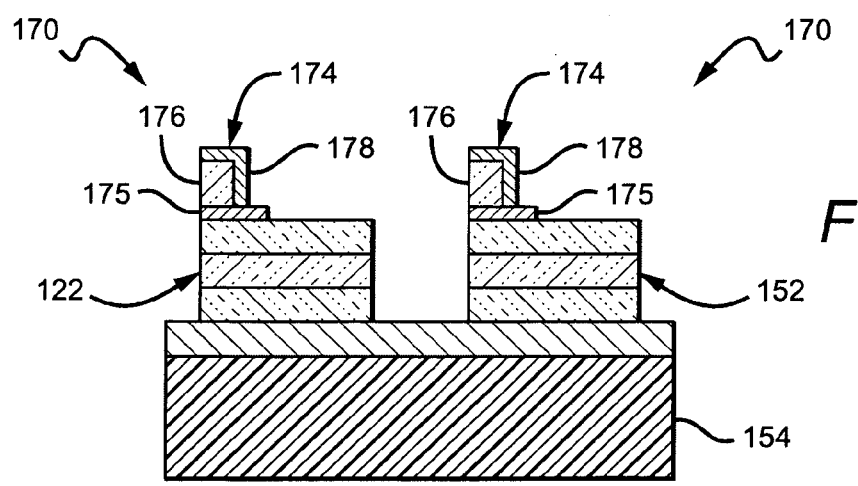
FIG. 11 is also a sectional view of another embodiment of an LED chip wafer according to the present invention.

FIG. 11 shows another embodiment of LED chips 170 still in wafer form that are similar to the LED chips 150 in FIG. 10, and the same reference numbers are used for similar features herein. The LED chips 170 comprise LEDs 152 flip-wafer bonded on a carrier substrate 154. A pedestal 174 is formed on each of the LEDs 152, preferably on the n-type contact 175. The pedestal 174 comprises a patternable material 176 in substantially the shape of the pedestal 174 that is covered with a pedestal layer 178 of conductive material that extends to the first contact 175. The patternable material 156 can comprise different materials compatible with LED fabrication and operation such as BCB, polymides and dielectrics. These materials can be formed on the LEDs 152 using known processes. Alternatively, pedestal 174 can be formed using patternable and electrically conducting materials such as silver epoxy or printable inks, in which case layer 178 may not be required. Other methods and approaches for fabricating pedestals can be used, some of which are described in John Lau, "Flip-Chip Technologies", McGraw Hill, 1996.

Like the embodiments above, the wafer comprising the LED chips 150 and 170 can be blanketed by a layer of coating material, burying the LED chips and their pedestals. The coating material can comprise the phosphors and binders described above, and can be thinned using the methods described above to expose the pedestals through the coating materials. The LED chips can then be singulated using the methods described above.

Figure 12:
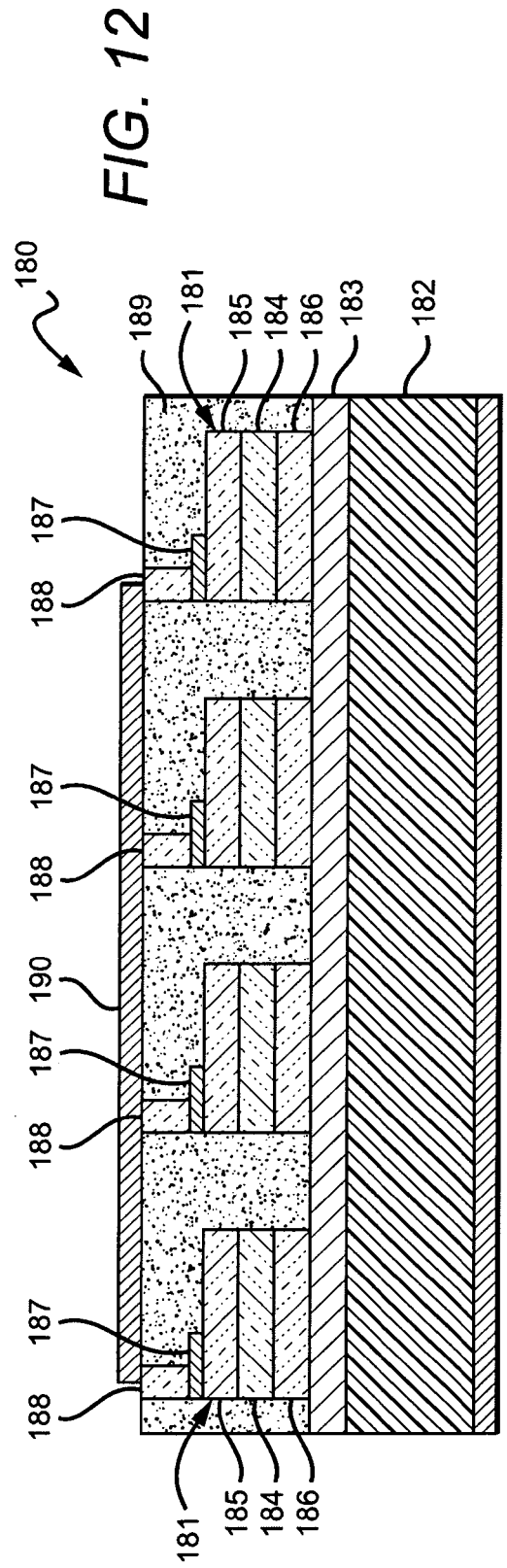
FIG. 12 is a sectional view of one embodiment of an LED array according to the present invention.

The present invention can also be used to fabricate wafer level emitter arrays. FIG. 12 shows one embodiment of wafer level LED array 180 that comprises LEDs 181 flip-wafer bonded on a carrier substrate 182 by a bond/metal layer 183. The LEDs comprise an active region 184 between first and second epitaxial layers 185, 186 with a first contact 187 on the first epitaxial layer 185. A pedestal 188 is included on the first contact 187 and a coating 189 of phosphor loaded binder coating blankets the LEDs 181, contacts 187 and pedestals 188, with the coating being thinned to expose the top of the pedestals 188. For the LED array 180 however, the individual LED chips are not singulated. Instead, an interconnecting metal pad 190 is included on the surface of the LED array 180, interconnecting the exposed tops of the pedestals 188 in a parallel fashion. An electrical signal applied to the metal pad 190 conducts to the LEDs having their pedestals 188 coupled to the metal pad 190, illuminating the LEDs in an array. It is understood that the LED array 180 can comprise many different numbers of LEDs arranged in different ways, such as in a row or block, depending on the LEDs that are interconnected by the metal pad 190.

Figure 13:
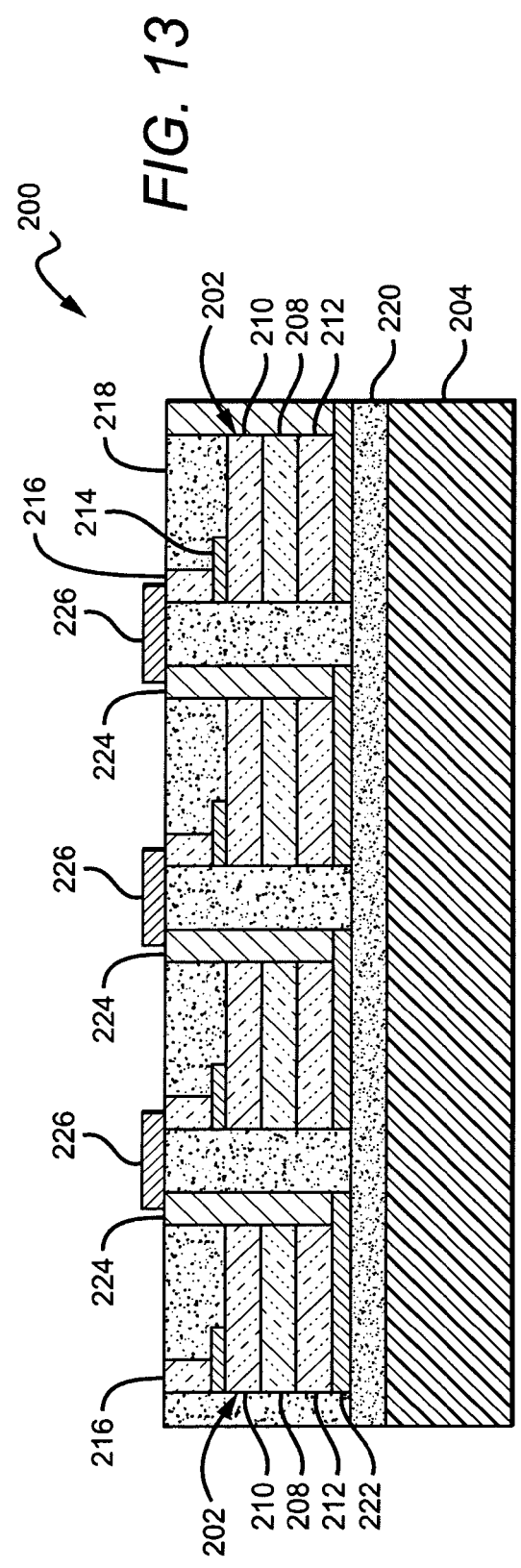
FIG. 13 is a sectional view of another embodiment of an LED array according to the present invention.

FIG. 13 shows another embodiment of an LED array 200 according to the present invention also having LEDs 202 flip-wafer bonded to a carrier substrate 204, with each of the LEDs 202 comprising an active region 208 between first and second epitaxial layers 210, 212. A first contact 214 is on the first epitixial layer 210 with a pedestal 216 formed on the first contact 214. A phosphor loaded binder coating 218 is included over the LEDs 202, first contacts 214 and pedestals 216, with the top surface of the pedestals 216 exposed. The LEDs 202 are mounted to the carrier substrate 204 by an electrically insulating bond layer 220 and a p-contact 222 is between each of the LEDs 202 and the insulating bond layer 220. Conductive vias 224 run between the p-contact and the surface of the coating 218 between the LEDs 202, and respective metal pads 226 run on the surface of the coating 118 between each of the posts 224 and a respective adjacent pedestal 216. This arrangement provides for a conductive path between the LEDs 202 such that the LEDs 202 are connected in series array, with the conductive path between the LEDs isolated from the substrate by the insulating bond layer 220. An electrical signal applied to the metal pads runs through each of the LEDs causing them to emit light in an array. It is understood that the LED array 200 can comprise many different numbers of LEDs arranged in different ways, such as in a row or block, depending on the LEDs that are interconnected by the metal pads 226.

Figure 14:
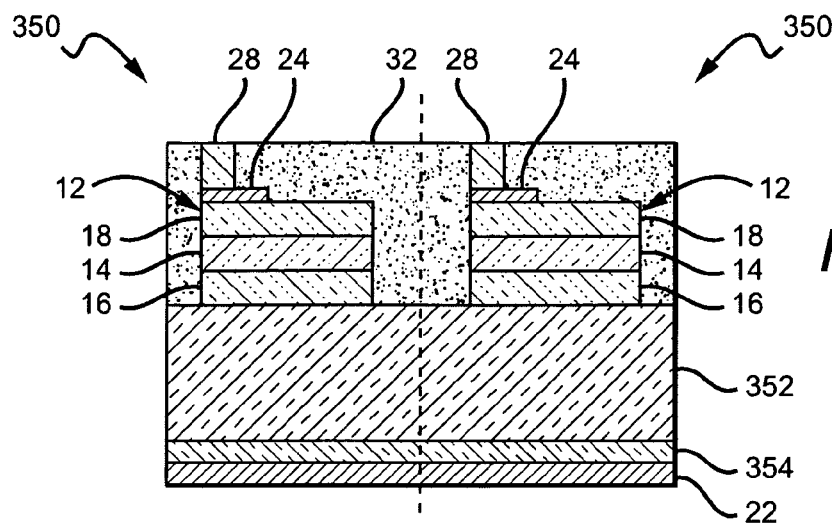
FIG. 14 is a sectional view of an embodiment of an LED chip wafer according to the present invention having a transparent substrate.

Many different LED chips having different structures can be fabricated according to the present invention. FIG. 14 shows another embodiment of LED chips 350 according to the present invention arranged similarly to the LED chips 10 shown in FIGS. 1*a* through 1*e* and described above, and for similar features the same reference numbers are used herein. The LED chips 350 have vertical geometry and comprise LEDs 12 each of which comprise an active region 14 between n-type and p-type epitaxial layers 16, 18. A pedestal 28 is formed on the p-type contact 24 with a phosphor loaded binder coating 32 covering the LEDs 12. In this embodiment however, the LEDs 12 are on a transparent substrate 352, which allows for a reflective layer 354 to be formed on the substrate 352 opposite the LEDs 12. Light from the LEDs 12 can pass through the substrate 352 and reflect back from the reflective layer 354 while experiencing minimal losses. The reflective layer 354 is shown between the contact 22 and the substrate 352, but it is understood that the reflective layer 354 can be arranged differently, such as being the bottommost layer with the contact 22 between the reflective layer 354 and the substrate 352.

Figure 15:
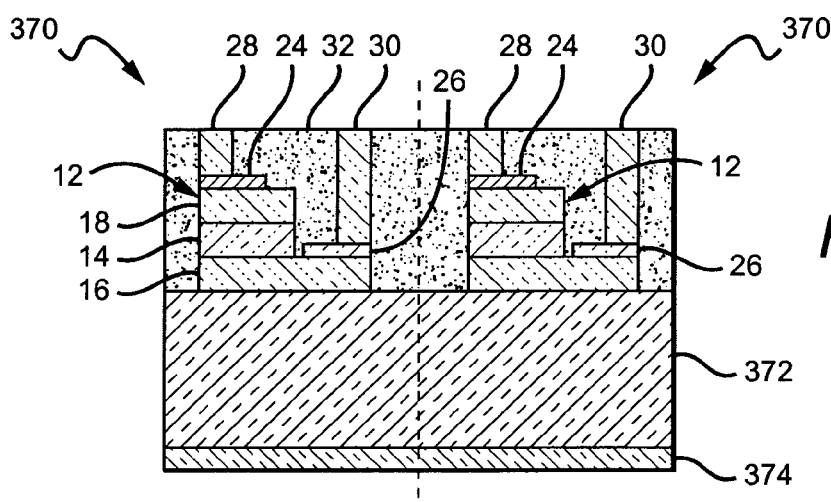
FIG. 15 is a sectional view of another embodiment of an LED chip wafer according to the present invention having a transparent substrate.

FIG. 15 also shows another embodiment of LED chips 370 according to the present invention also arranged similar to the LED chips in FIGS. 1*a* through 1*e*. The LED chips 370 in this embodiment have lateral geometry and comprise LEDs 12 each of which comprise an active region 14 between n-type and p-type epitaxial layers 16, 18. A portion of the p-type layer 18 and the active region 14 is etched to reveal the n-type layer 16, with p-type contact 24 on the p-type layer 18 and the n-type contact 26 on the n-type layer 16. A p-type pedestal 28 is on the p-type contact 24 and n-type pedestal 30 is on the n-type contact 26. A phosphor loaded binder coating 32 covers the LEDs 12 with the pedestals 28, 30 exposed through the coating 32. The LEDs 12 are on a transparent substrate 372 and a reflective layer 374 included on the substrate 372 opposite the LEDs 12. The LEDs 12 have a lateral geometry with an p-type contact 24 and p-type pedestal 28 on the top of each of the LEDs 12. The reflective layer 374 also reflects light from the LEDs with the light experiencing minimal loss through the substrate 372.

Figure 16:
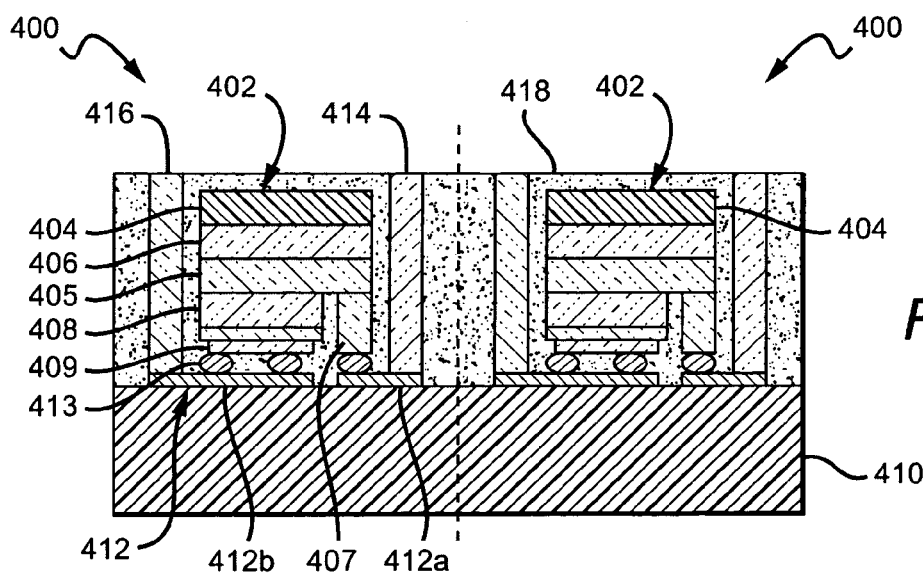
FIG. 16 is a sectional view of another embodiment of an flip-chip LED chip wafer according to the present invention.

Many different variations to the LED chips can be fabricated according to the present invention and FIG. 16 shows another embodiment of LED chips 400 having LEDs 402 having an active region 405 between n- and p-type layers 406, 408, on a growth substrate 404. It is understood that the LEDs 402 can also be provided with the growth substrate thinned or after the growth substrate has been removed. The LEDs also have n-type and p-type contacts 407, 409. The LEDs 402 are diced or singulated and flip-chip bonded to a submount/carrier wafer 410. Conductive traces 412 are formed on the submount/carrier wafer 410 with each of the LEDs 402 mounted on the traces 412, with the first trace 412*a* in electrical contact with the n-type layer 406 and the second trace 412*b* in contact with the p-type layer 408. Conventional traces can be used comprising aluminum (Al) or Au deposited using known techniques such as sputtering. The LED 402 is mounted to the traces 412 by flip-chip bonds 413 that can be arranged in conventional ways using known materials such as Au, or gold/tin solder bumps or stud bumps.

It is further understood that the pedestals in FIG. 16, and in the embodiments discussed above and below, can also be made of an insulating material coated by a conductive layer. In one embodiment, the pedestals can comprise substrate material or submount/carrier wafer material. For the LED chips 400, the submount/carrier wafer can be fabricated with pedestals with each of the LEDs mounted between pedestals. A conductive layer can be formed over the pedestals in contact with the conductive traces or in contact with the LED using other arrangements. It is further understood that the pedestals can have many different shapes and sizes, and in one embodiment can comprise a reflective cup with an LED mounted within the cup. The cup can be coated with a conductive layer in contact with the conductive traces or the LED using other arrangements. During planarization of the phosphor binder coating, the top of the cups can be exposed for contacting. In still other embodiments, the cup can have its own pedestals that can be exposed during planarization.

An n-type pedestal 414 is formed on the first trace 412*a* and a p-type pedestal 416 is formed on the second trace 412*b*, with both pedestals being formed using the methods described above. A phosphor/binder coating 418 is included over the LEDs 402, burying the pedestals 414, 416. The coating 418 can then be planarized to expose the pedestals 414, 416 for contacting, or in other embodiments the recesses can be formed in the coating to expose the pedestals 414, 416. The LED chips can then be singulated using the processes described above.

The fabrication method described in conjunction with LED chips 400 allows for the use of good quality singulated LEDs 402 with the desired emission characteristics to be selected for mounting to the wafer 404. The arrangement also allows for the mounting of LEDs 402 to the wafer with larger spaces between the LEDs 402 while not wasting valuable epitaxial material through etching of the material to form the spaces.

Figure 17:
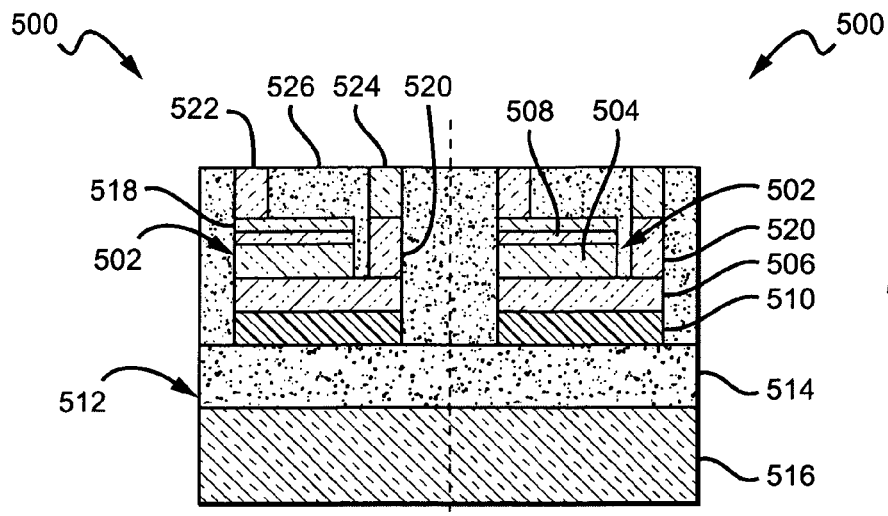
FIG. 17 is a sectional view of another embodiment of an LED chip having a phosphor loading carrier substrate.

FIG. 17 shows still another embodiment of LED chips 500 according to the present invention having singulated lateral geometry LEDs 502 mounted to a carrier substrate. Each of the LEDs 502 comprises an active region 504 between n- and p-type layers 506, 508, all formed successively on a growth substrate 510. The substrate 510 can be many different materials, with the preferred substrate being a transparent material such as sapphire. The LEDs 502 are singulated with at least a portion of the growth substrate 510 remaining.

The LEDs 502 are then mounted to a carrier substrate 512 with the substrate down. The carrier substrate 512 comprises a first phosphor/binder coating 514 on a transparent substrate 516. The first coating 514 can be adhesive to hold the LEDs 502 or an additional adhesive materials can be used.

A p-type contact 518 is provided on the p-type layer 508 and an n-type contact 520 is provided on the n-type layer 506. The contacts 518, 520 can comprise many different materials, with the preferred material being reflective. By being reflective, the contacts 518, 520 reflect active region light making the carrier substrate 512 the primary emission surface. P-type pedestal 522 is formed on the p-type contact 518, and n-type pedestal 524 is formed on the n-type contact 520 as described above. A second phosphor/binder coating 526 is formed over the LEDs 502, burying the pedestals 522, 524. As described above, the second coating 526 can then be planarized to reveal the pedestals 522, 524.

The LED chips 500 can then be singulated and this arrangement provides LED chips 500 having LEDs 502 that are surrounded by a phosphor layer provided by the first and second coating 514, 526. The singulated LED chips 500 can also be packaged as a conventional flip-chip device except with the first and second coatings providing a white-emitting LED flip chip without further phosphor processing. This embodiment provides the further advantage of ability to use good quality singulated LEDs 502 with the desired emission characteristics for mounting to the wafer carrier wafer 512, such that the resulting LED chips 502 are of good quality. The LEDs 502 can also be mounted to the wafer with larger spaces between the LEDs 502 while not wasting valuable epitaxial material through etching of the material to form the spaces.

Figure 18A:
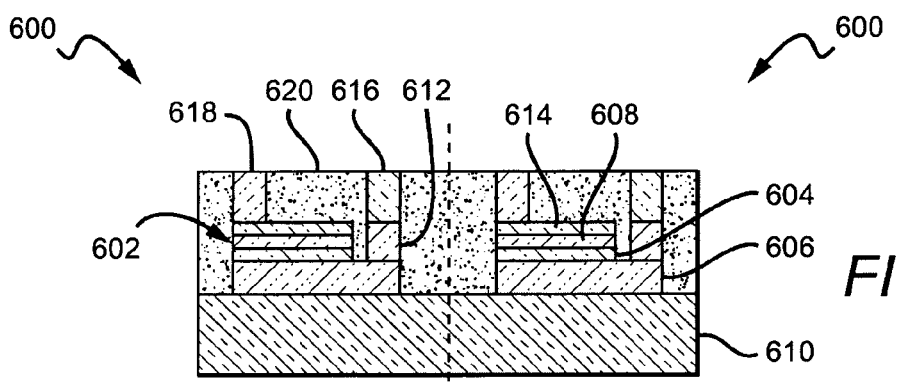
FIGS. 18a through 18d are sectional views of another embodiment of an LED chip wafer at fabrication steps in a method according to the present invention utilizing a trenched substrate.

FIGS. 18a through 18d show still another embodiment of LED chips 600 according to the present invention. Referring first to FIG. 18a, each of the LED chips comprises LEDs 602 each of which has an active region 604 between n- and p-type layers 606, 608, all formed successively on a growth substrate 610 that is preferably a transparent material such as sapphire. The LEDs 602 have a lateral geometry with a reflective n-type contact 612 on the n-type layer 606 and a reflective p-type contact 614 on the p-type layer 608. An n-type pedestal 616 is formed on the n-type contact 612, and a p-type pedestal 618 is formed on the p-type contact 614. A first phosphor/binder coating 620 is provided over the LEDs 602, initially burying the pedestals 616, 618, with coating then planarized to reveal the pedestal.

Figure 18B:
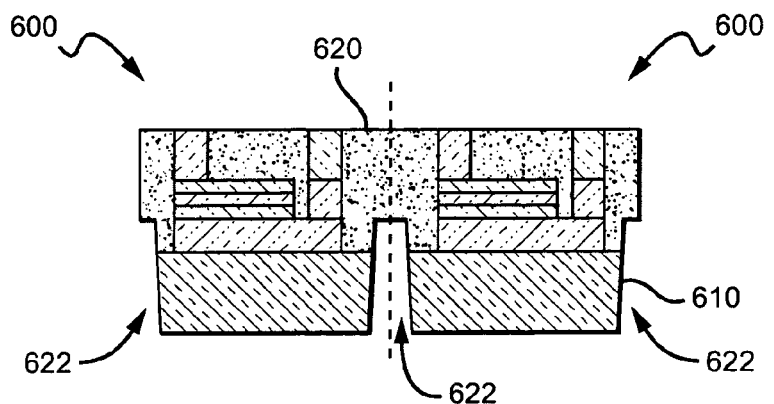
Figure 18C:
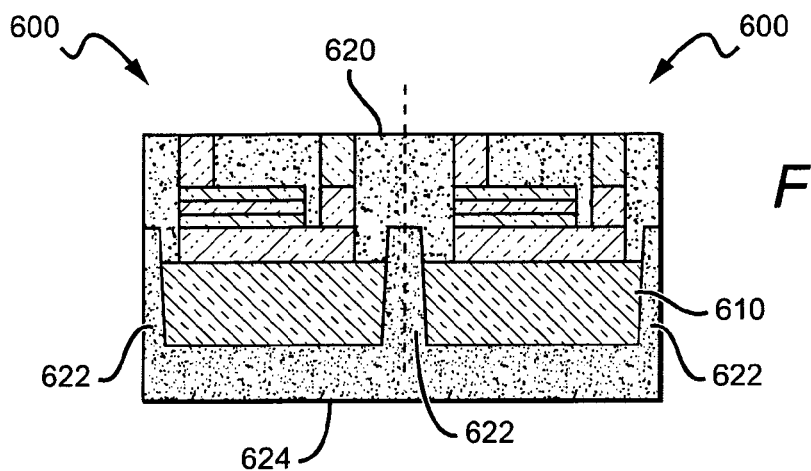
Figure 18D:
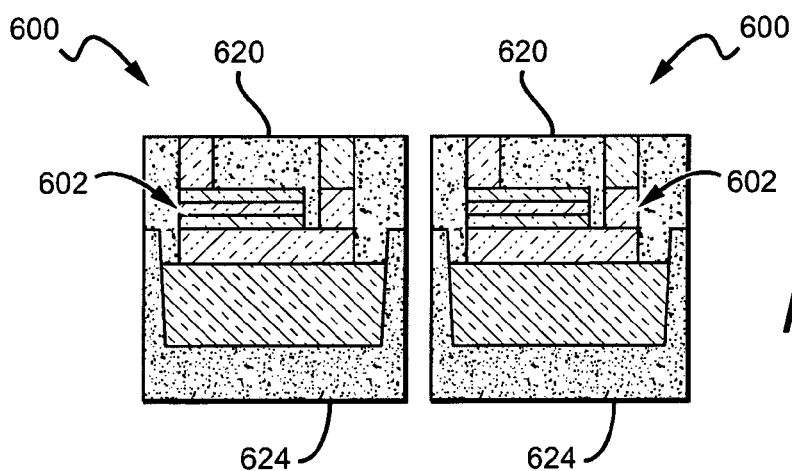

Referring now to FIG. 18b, backside trenches 622 are formed through the substrate 610 and partially into the coating 620, with the trenches 622 arranged between the LEDs 602. The trenches 622 can be formed using many different methods such as by etching or cutting. Referring now to FIG. 18c, a second phosphor/binder coating 624 can be formed over the trench side of the substrate 610, filling the trenches 622. The second coating can then be planarized as desired. Referring to FIG. 18d, the LED chips 600 can be singulated with the LEDs 602 being surrounded by a phosphor layer provided by the first and second coatings 620, 624. The LED chips 600 provide similar advantages as the LED chips 500 in FIG. 17, and provides good quality flip-chip devices that can provide white light emission without additional phosphor processing.

Referring again to FIGS. 18a and 18b, as an alternative to forming trenches 622, the growth substrate 610 can be removed entirely to expose the bottom surface of the n-type layer 606. The second phosphor/binder coating 624 can then be formed over the exposed n-type layer, and planarized as desired.

The present invention can also be used to cover individual LEDs instead of those on formed in an LED chip wafer. In these embodiments, the LED chips can be singulated and then mounted in a package or to a submount or PCB. The LED chips can then be coated and planarized according to the present invention to expose the pedestal(s) for contacting.

Figure 19:
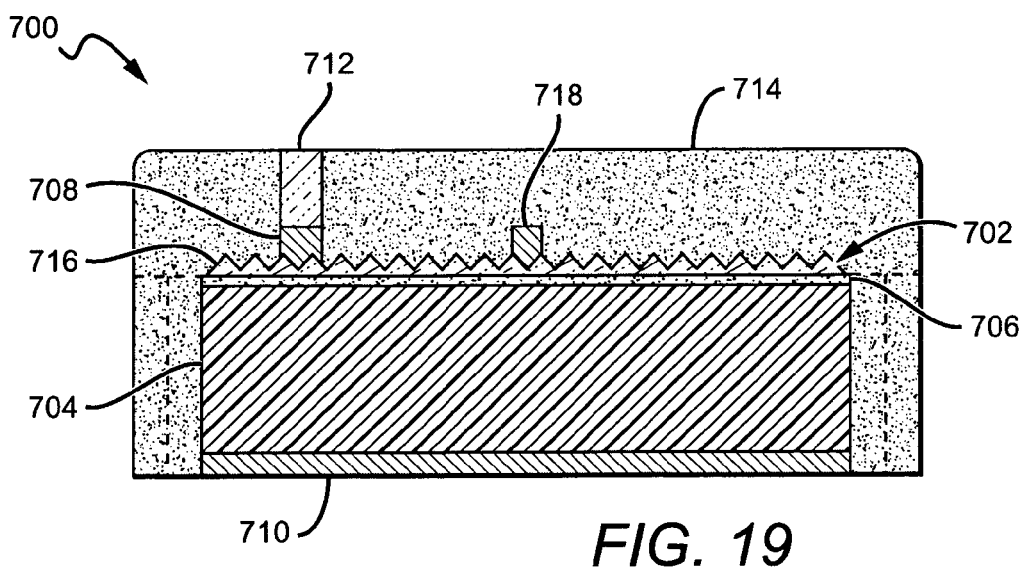
FIG. 19 is a sectional view of another embodiment of an LED chip according to the present invention having a textured surface.

LED chips according to the present invention can be arranged in different ways with many different features such as features to enhance LED chip light extraction. FIG. 19 shows another embodiment of an LED chip 700 that can be fabricated utilizing the methods described above. It comprises an LED 702 on a substrate 704 with the LED preferably flip-chip mounted on the substrate 704 by a bonding material 706. In other embodiments the substrate can comprise the growth substrate for the LED 702. The LED 702 can be made of many different semiconductor materials such as those described above, and can comprise the layers described above including the active layer/region and the oppositely doped layers (n-type and p-type). For ease of illustration and understanding, the different layers of the LED 702 are not shown.

The LED chip 700 further comprises first and second contacts 708, 710. For flip-chip LEDs, the first contact 708 is on the n-type layer and the second contact 710 is in the form of a layer of conductive material on the substrate 704 arranged such that an electrical signal applied to the second contact 710 spreads through the substrate 704 to the LED's p-type layer. The contacts 708, 710 can be made of any of the conductive materials described above, with the second contact 710 in this embodiment comprising AuSn. It is understood that for lateral geometry devices the first and second contacts can be included on the surfaces of the LED 702.

A pedestal 712 is included on the first contact 708 that can be made of the materials described above and can be fabricated using the methods described above. For lateral geometry devices a second pedestal can be included on the second contact. A phosphor/binder coating 714 can be included over the LED 702 with the pedestal 712 extending from the first contact 708 to the top surface of the coating 714. The coating 714 can comprise the materials described above and can be applied and planarized using the methods described above. In the embodiment shown, the surface 716 of the LED 702 is textured, roughened or patterned to enhance light extraction. The texturing can be applied using known mechanical or etching methods as well as micro-nano imprinting methods. It is also understood that the opposite surface of the LED that is adjacent to the bonding material 706 can also be textured to enhance light extraction, with the texturing performed prior to flip-chip mounting and with the texturing embedded in the bonding material 706.

For the LED chip 700, the coating 714 extends along the side surfaces of the substrate 704 which can be formed using many different methods including the groove and substrate thinning method described above and shown in FIGS. 2a to 2f. For LED chips formed using this method and formed with stabilization portion of the substrate remaining, a portion of the side surface will remain that is uncovered by the coating 714 corresponding to the stabilization portion. In an alternative groove and substrate thinning method according to the present invention, the grooves can be made wider such that when they are filled with the coating the wafer can be stabilized by the coating material within the grooves. The substrate can then be thinned up to the bottom of the grooves, and the LED chips separated. This can leave a coating along substantially all of the side surfaces of the LED chips, which can enhance uniform LED chip light emission.

Different embodiments of LED chips can have different dimensions for their layers and features. In the embodiment shown, the second contact 710 can be approximately 3 µm thick, the substrate 704 can be approximately 100 µm thick and the LED 702 can have an overall thickness of approximately 3 µm. The roughening of the LED can result in features having different depths in said LED 12, with the roughening providing valleys having a depth of approximately 2 µm. Although the depth of the textured features can vary, the preferred depth is greater than 10% of the overall thickness of the LED 702. The thickness of the coating 714 over the top surface of the LED 702 is approximately 30 µm as measured from the lowest point in the valleys. The contact 708 is approximately 5 µm thick as measured from the lowest point in the valleys, with the pedestal being approximately 25 µm tall.

Embodiments of LED chips according to the present invention can also comprise additional features to further enhance light emission uniformity and efficiency. Referring again to FIG. 19, a current spreading structure 718 can be included on the LED 702 to improve current spreading and injection from the first contact 708. The current spreading structure can have many different forms, but preferably comprises fingers of conductive material on the surface of the LED 702 contacting the first contact 714. The current spreading structure can be deposited using known methods and can comprise the materials described above for the contacts and pedestals including Au, Cu, Ni, In, Al, Ag or combinations thereof and conducting oxides and transparent conducting oxides.

Figure 20:
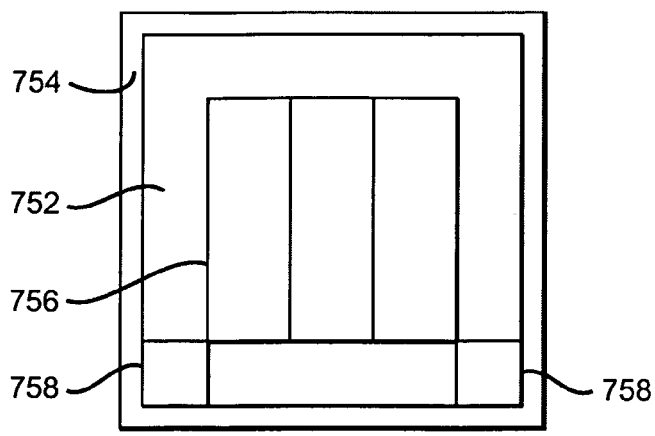
FIG. 20 is a top view of another embodiment of an LED chip according to the present invention having a current spreading structure.

FIG. 20 shows the top view of another embodiment of the an LED chip 750 according to the present comprising an LED 752 and a phosphor/binder coating 754 formed over the LED 752 as described above. The LED chip 750 further comprises two first contacts 758 on the surface of the LED 752, each of which can have a pedestal (not shown) reaching from its respective one of the first contacts 758 to the surface of the coating 754. It is understood that other embodiments can have one first contact or more than two first contacts, with all or some of the contacts having a pedestal.

A current spreading structure 756 is included on the surface of the LED 752 and in contact with both the first contacts 758. The structure 756 comprises conductive fingers arranged in a grid on the LED 752 with the fingers spaced to enhance current spreading from the contacts 758. In operation, an electrical signal is applied to the one or more pedestals that is conducted through the pedestals to the contacts 758. Current spreads from the contacts 758 to the current spreading structure 756 and into the LED 752.

Referring again to FIG. 19, layers and materials can also be included to improve current spreading on both sides of the LED 702. A layer of transparent conductive material (not shown) can be included on the textured surface of the LED 702, with the coating 714 over the textured surface. The transparent conductive material can enhance current spreading from the contact 708 and current spreading structure 718, and can comprise different materials such as ITO or other transparent conductive oxides. A current spreading material can also be included in the layer of bonding material to enhance current spreading from the second contact 710 and substrate 704, to the LED 702. The current spreading material can comprise the same material used for the current spreading structure 716 and the layer of transparent conductive material.

Figure 21:
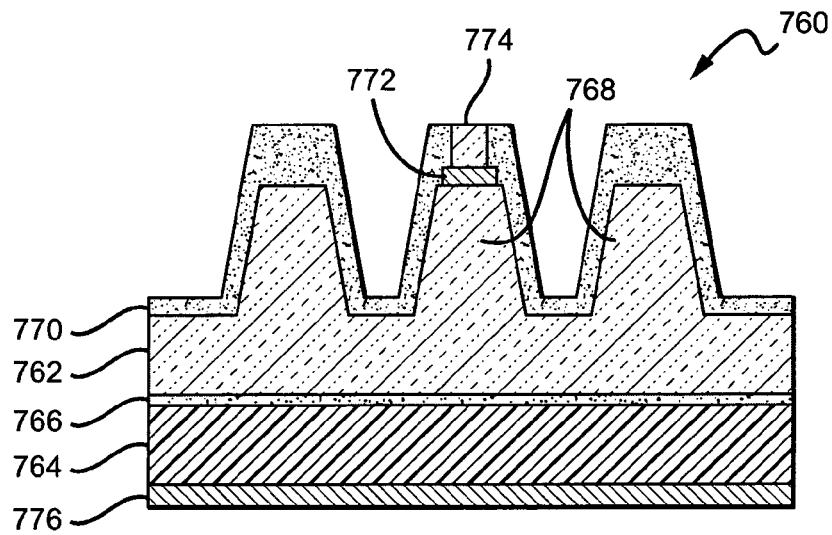
FIG. 21 is a sectional view of another embodiment of an LED chip according to the present invention having a textured surface.

FIG. 21 shows another embodiment of the an LED chip 760 according to the present invention comprising an LED 762 mounted on a substrate 764 by a bonding material 766. The LED has larger uniform textured features 768 with a phosphor/binder coating 770 over the features. The LED chip further comprises a first contact 772 and pedestal 774 and a second contact layer 776 on the substrate 764. In other embodiments, more than one pedestal can be used. The coating 770 can conformally coat over the features 768 that can be applied using different methods such as spin coating, and like the embodiments above the initial coating covers the pedestal. The coating can then be planarized down to the pedestal 774 so that it can be contacted.

Figure 22:
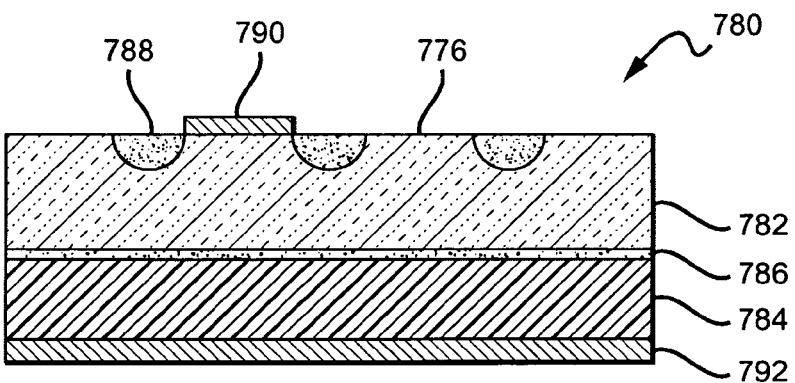
FIG. 22 is a sectional view of another embodiment of an LED chip according to the present invention having a textured surface.

FIG. 22 shows another embodiment of an LED chip 780 according to the present invention comprising an LED 782 mounted on a substrate 784 by a bonding material 786. The LED 782 has semicircle texture pattern and the LED 782 is covered by a phosphor/binder coating 788 that fills the texture pattern. The coating 788 can then be planarized to reveal the LED chip mesas 776 and a first contact 790 can then be deposited on one or more of the mesas. Alternatively, a contact and pedestal can be included on one or more of the mesas prior to coating, with the coating then planarized to the pedestals. This method results in at least some of the coating remaining on the mesas. A second contact 792 can also be included on the substrate 784.

In other embodiments of LED chips according to the present invention, the coating can have different geometries and can cover less than all of the LED or can cover most of the surfaces of the LED chip. Referring again to FIG. 19, the coating 714 covers the side surfaces of the substrate 704 such that light from the LED 702 that would otherwise escape from the side surfaces without encountering the conversion phosphors now passes through at least some phosphors such that at least some of the light can be converted. This helps reduce the emission of unconverted light around the edges of the LED chip 700 particularly in those embodiments having a transparent substrate. For white LED chips, this arrangement can reduce emission of unconverted blue light from the side surfaces, which can result in more uniform white emission from the LED chip. In one embodiment, the thickness of the coating 714 on the side of the LED chip 700 is approximately equal to the thickness over the LED 702 such that light emitting from different surfaces of the LED chip 700 passes through a similar amount of conversion phosphor. This can result in substantially uniform emission from the LED chip 700 at different viewing angles.

Figure 23:
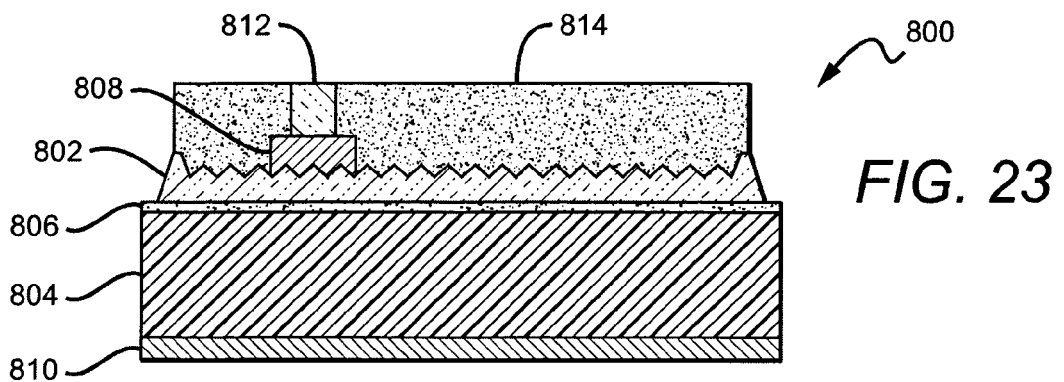
FIG. 23 is a sectional view of another embodiment of an LED chip according to the present invention.
Figure 24:
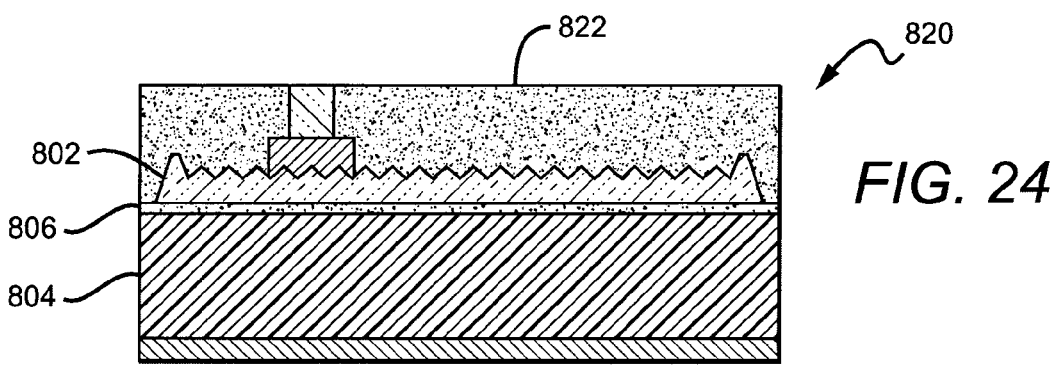
FIG. 24 is a sectional view of another embodiment of an LED chip according to the present invention.
Figure 25:
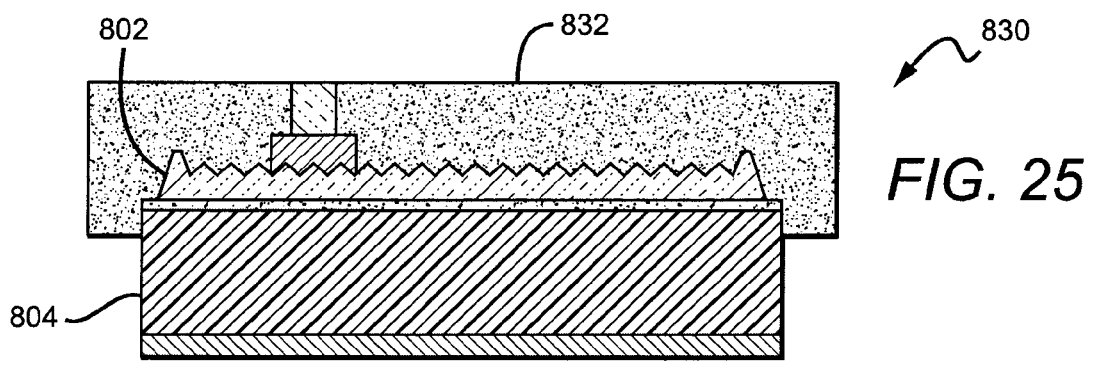
FIG. 25 is a sectional view of another embodiment of an LED chip according to the present invention.

In some applications unconverted light emitting from the side surfaces of the LED chip can be acceptable. FIG. 23 shows another embodiment of an LED chip 800 that is similar to the LED chip 700 described above and comprising an LED 802, substrate 804, bonding layer 806, first contact 808, second contact 810, pedestal 812 and phosphor/binder coating 814. It is understood that the LED 802 comprises multiple layers but is shown as a single layer for ease of illustration and explanation. The top surface of the LED can also be textured as described above. The LED chip 800 has a coating 822 that covers all or most of the surface of the LED 802 but leaves the remaining surfaces of the LED chip uncovered. FIG. 24 shows another embodiment of an LED chip 820 having a coating 822 that covers the LED 802 and the exposed top surface of the substrate 804 (or bonding layer 806), but leaves the substrates side surfaces uncovered. FIG. 25 shows still another embodiment of an LED chip 830 having a coating 832 covering the LED 802, the top surface of the substrate 804, and a portion of the substrate's side surfaces. For the LED chips 800, 820 and 830, at least some unconverted light can escape from the side surfaces. In still other embodiments and as further described below, the LED chips can be mounted in packages that can compensate for side emission of unconverted light.

Figure 26:
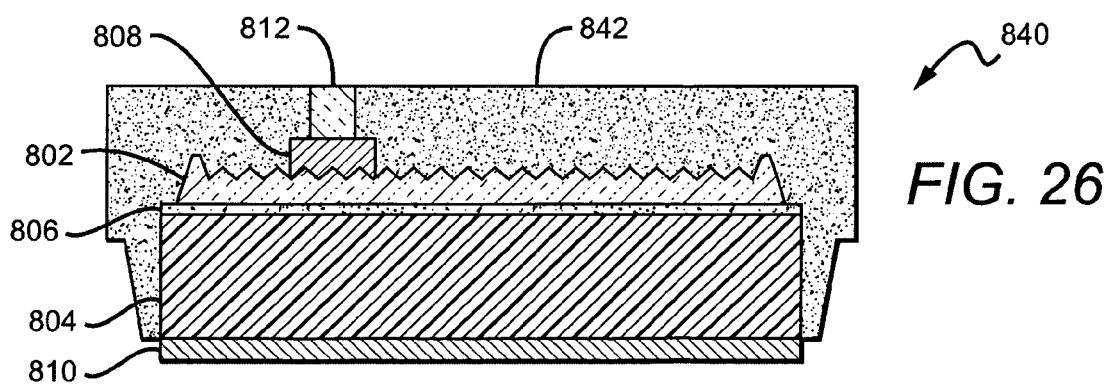
FIG. 26 is a sectional view of another embodiment of an LED chip according to the present invention.

The coating can also be tailored such that it can have different thicknesses at different locations on the LED chip. FIG. 26 shows still another embodiment of an LED chip 840 also having an LED 802, substrate 804, bonding layer 806, first contact 808, second contact 810 and pedestal 812. The LED chip 840 has a coating 842 covering the LED 802, the top exposed surface and side surfaces of the substrate 804. The lower portion of the coating 852 on the side surfaces is thinned.

Figure 27:
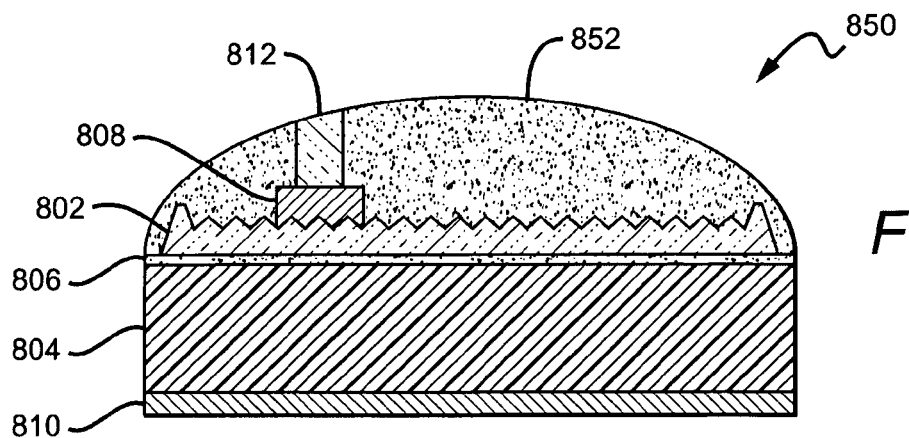
FIG. 27 is a sectional view of another embodiment of an LED chip according to the present invention having a dome shaped coating.
Figure 28:
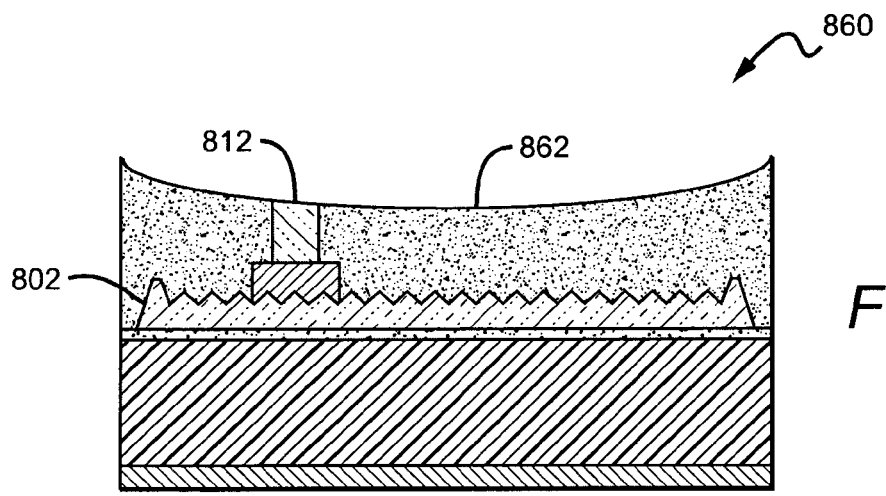
FIG. 28 is a sectional view of another embodiment of an LED chip according to the present invention having a concave shaped coating.

The coating in LED chips according to the present invention can also take different shapes over the LED. FIG. 27 shows another embodiment of an LED chip 850 according to the present invention having an LED 802, substrate 804, bonding layer 806, first contact 808, second contact 810 and pedestal 812. In this embodiment, the coating 852 is in the shape of a dome over the LED 802, with the pedestal exposed through the surface of the coating. In other embodiments, the coating can also be in the shape of a dome and can also at least partially cover the side surfaces of the substrate 804. FIG. 28 shows still another embodiment of an LED chip 860 according to the present invention having a coating 862 with a convex shape over the LED 802. Like the other embodiments, the pedestal is exposed through the top surface of the coating 862 and in other embodiments the side surface of the substrate 804 can also be at least partially covered.

Figure 29:
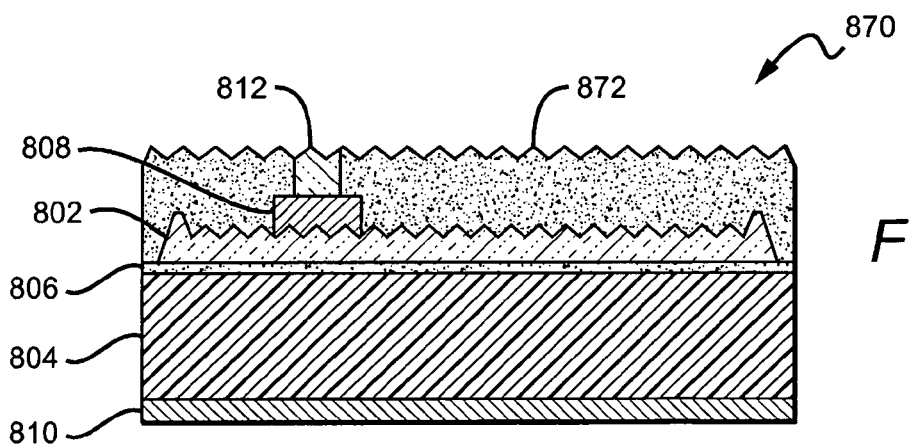
FIG. 29 is a sectional view of another embodiment of an LED chip according to the present invention having a coating with a textured surface.

In other embodiments, the surface of the coating can also be modified to enhance light extraction from LED chip. FIG. 29 shows an embodiment of an LED chip 870 according to the present invention having a an LED 802, substrate 804, bonding layer 806, first contact 808, second contact 810 and pedestal 812. The LED chip further comprises a coating 872 having a textured top surface to enhance light extraction. The texturing can be formed using the same processes as those used to texture the surface of the LED, such as known mechanical or chemical etching processes. In some embodiments having a textured LED, the texturing of the LED can transfer to the coating when it is applied and any current spreading structures can also transfer variations in the surface of the coating. In the preferred embodiment, the variations in the texturing on the coating 872 exceeds more than 10% of the coating thickness. It is understood that the side surfaces of coatings described in the above embodiments can also be textured.

Figure 30:
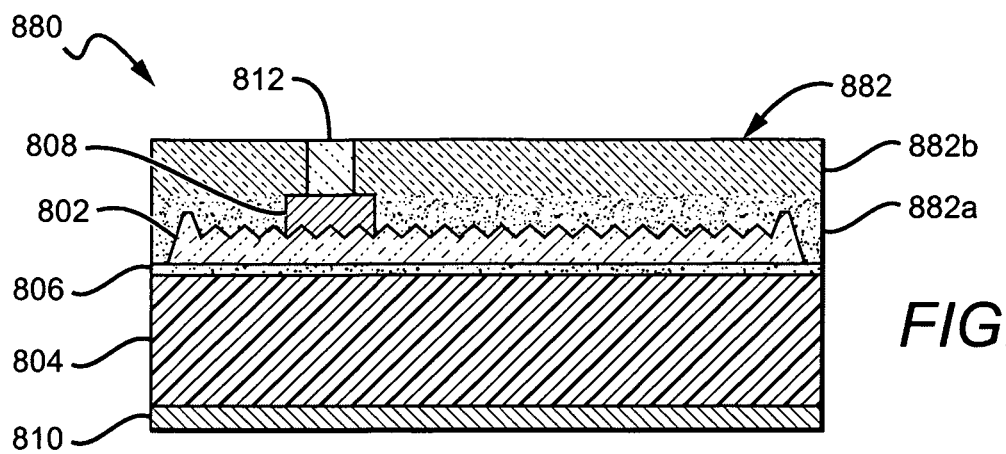
FIG. 30 is a sectional view of another embodiment of an LED chip according to the present invention having portions with different concentrations of phosphors.

The embodiments of the coatings described above are shown with phosphors that are substantially uniform throughout. Different embodiments of LED chips according to the present invention can also have coating with sections having different concentrations and types of phosphors. FIG. 30 shows an embodiment of an LED chip 880 according to the present invention having an LED 802, substrate 804, bonding layer 806, first contact 808, second contact 810 and pedestal 812. It further comprises a coating 882 having first portion 882a with one or more phosphors and a second portion 882b not having phosphors and being substantially transparent. The coating 882 can be fabricated in different ways such as by applying a first coating layer with phosphor and then applying a second coating layer on the first layer that does not have a phosphor.

Figure 31:
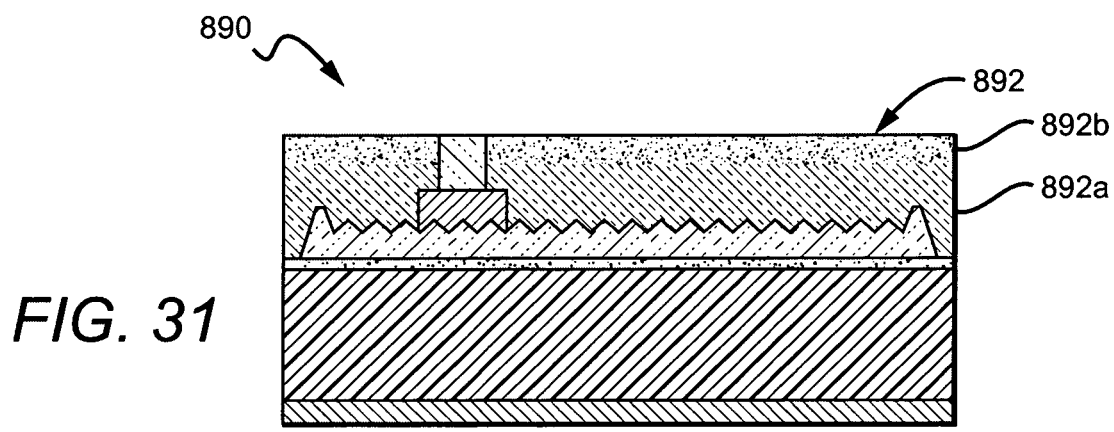
FIG. 31 is a sectional view of another embodiment of an LED chip according to the present invention having portions with different concentrations of phosphors.

FIG. 31 shows another embodiment of an LED chip 890 having a coating 892 having a first portion 892a having no phosphors and a second portion 892b of the first having one or more phosphors. This coating can also be fabricated by depositing different layers, with the first having no phosphors and the second having phosphors. It is understood that additional layers or portions can be included having different phosphors of different concentration and the coatings in these embodiments can also have the different shapes and geometries described above and can also have surface texturing.

Figure 32:
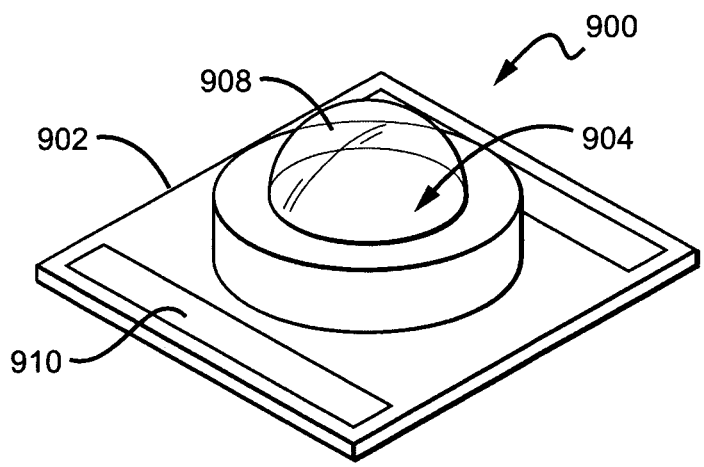
FIG. 32 is a sectional view of an LED package according to the present invention.

The LED chips described above can be mounted in many different fixtures or LED packages. FIGS. 32 and 33 show one embodiment of an LED package 900 utilizing one or more LED chips according to the present invention. The package 900 generally comprises a substrate/submount ("submount") 902, an LED chip 904 mounted on the substrate 902 and a reflector cup assembly ("reflector cup") 906 also mounted on the submount 902. It is understood, however, that in other LED package embodiments a reflector cup is not included, particularly in those embodiments where there is minimal LED light leakage from the LED's side surfaces.

Secondary optics, such as a lens 908 can be placed or formed over the LED 904, such as on the reflector cup 906 and bonded to the package using different mounting methods. In those embodiments not having a reflector cup the lens can be formed or placed directly over the LED using known techniques. In the embodiment shown, light from the LED 904 passes primarily through the lens 908 with at least some of the light emitted laterally from the LED chip being reflected by the reflector cup 906 to contribute to useful emission from the package 900. Space between the bottom of the lens 908 and the remainder of the package 900 can be filled with an encapsulating material or encapsulant such as a liquid silicone gel (not shown) with the bottom of the lens 908 in contact with the gel. In other embodiments the lens 908 can also be in contact with the LED 904. The package 900 can then be heat cured, which causes the encapsulating material to solidify and adhere to the lens 908, bonding the lens 908 in place over the LED 904 and reflector cup 906.

Many different lenses with different features such as texturing and scattering particles can also be utilized. In some embodiments the lens can have a flat disk shape. Many different encapsulating materials can also be used in the packages according to the present invention to provide different output characteristics. In the preferred embodiment the LED package emits a white light with the various components arranged to achieve the desired color point.

The submount 902 may be formed of many different materials with a preferred material being electrically insulating. Suitable materials include, but are not limited to aluminum oxide or aluminum nitride. The reflector cup 906 should be formed of durable, high melting temperature material that can withstand subsequent packaging manufacturing steps and the heat generated by the package during operation. Many different materials can be used, such as high melting temperature material including plastics, such a Novella resin, or liquid crystal polymers. The submount 902 has a top surface comprising electrical traces 910 providing a conductive path for electrical connection to the LED 904 using known contacting methods.

In LED packages utilizing convention coating methods such as the "glob" method or EPD, much of the area within the reflective cup 906 can be covered by a conversion material and its binder, including the LED chip, the surface of the substrate, and the surfaces of the reflective cup. Utilizing LED chips fabricated according to the present invention, the phosphor/binder coating is confined to the LED chip with the other surfaces remaining uncovered. The LED package 900 can also compensate for emission of unconverted light around the edges of the LED package, by reflecting the unconverted light to mix with the converted light.

FIG. 34 is a table showing performance characteristics of an LED package similar to the one shown in FIGS. 32 and 33 utilizing an LED chip similar to the LED chip 700 described above and shown in FIG. 19. For a current applied to the LED chip of 350 milli-amps (mA) the LED package exhibits a luminous flux of approximately 98 lumens (lm) and an efficacy of 86 lumens per watt (lm/W). For a higher drive current of 700 mA, the package exhibits a luminous flux of 167 lm and an efficacy of 72 lm/W. FIG. 35 is a graph showing performance comparisons between the LED packages with LED chips having standard contacts, such as PtAg, compared to the improved performance with LED chips with modified mirror contact.

Although the present invention has been described in detail with reference to certain preferred configurations thereof, other versions are possible. Therefore, the spirit and scope of the invention should not be limited to the versions described above.

We claim:

1. A light emitting diode (LED) chip, comprising:
   an LED comprising a textured surface, said LED comprising semiconductor layers;
   a contact on said semiconductor layers;
   a pedestal in electrical contact with and formed on said contact; and
   a coating at least partially covering said LED, said coating comprising a light emitting surface, said pedestal extending through to the light emitting surface of said coating and exposed at the surface of said coating for electrical contact, wherein said coating is conformal such that said coating comprises a substantially uniform thickness over said textured surface.

2. The LED chip of claim 1, wherein said LED emits white light.

3. The LED chip of claim 1, wherein said coating is on the top surface of said LED.

4. The LED chip of claim 1, wherein said coating is on the top and side surfaces of said LED.

5. The LED chip of claim 1, wherein said LED is on a substrate.

6. The LED chip of claim 5, wherein said coating is also on the side surfaces of said substrate.

7. The LED chip of claim 1, further comprising a current spreading structure.

8. The LED chip of claim 7, wherein said coating comprises portions having different concentrations of phosphors.

9. The LED chip of claim 1, further comprising a current spreading layer.

10. The LED chip of claim 1, wherein the surface of said coating is textured.

11. The LED chip of claim 1, wherein said coating is shaped.

12. The LED chip of claim 1, wherein said coating comprises one or more phosphors.

13. The LED chip of claim 1, wherein said pedestal comprises one or more stud bumps.

14. The LED chip of claim 1, wherein said pedestal comprises a microwire.

15. The LED chip of claim 1, further comprising a reflective layer formed integral to said substrate.

16. The LED chip of claim 1, wherein said pedestal is exposed for external connection.

17. The LED chip of claim 1, wherein said coating is planarized to expose a top surface of said pedestal.

18. The LED chip of claim 1, wherein said pedestal covers less than all of a top surface of said contact.

19. The LED chip of claim 1, wherein said contact is directly on one of said semiconductor layers.

20. The LED chip of claim 1, wherein said pedestal comprises a single layer.

21. A light emitting diode (LED) chip, comprising:
an LED mounted on a substrate, wherein a surface of said LED is textured for light extraction;
an integral coating at least partially covering said LEDs and comprising a light emitting surface, said integral coating formed by at least partially covering said LED with said coating at the wafer level and curing said coating at the wafer level such that said integral coating completely covers the sides of said substrate;
a contact on said LED; and
a pedestal in electrical contact with said contact, said pedestal further extending through and to the light emitting surface of said coating and exposed at the light emitting surface of said coating.

22. The LED chip of claim 21, wherein said coating is on the top surface of said LED.

23. The LED chip of claim 21, wherein said coating is on the top and side surfaces of the LED.

24. The LED chip of claim 21, wherein said coating is on the top and side surfaces of said LED and on the side surfaces of said substrate.

25. The LED chip of claim 21, further comprising a reflective layer.

26. The LED chip of claim 21, wherein the top surface of said LED is textured.

27. The LED chip of claim 21, wherein said substrate is at least partially transparent.

28. The LED chip of claim 21, wherein said substrate is opaque.

29. The LED chip of claim 21, further comprising a current spreading structure.

30. The LED chip of claim 21, further comprising a current spreading layer.

31. The LED chip of claim 21, wherein the surface of said coating is textured.

32. The LED chip of claim 21, wherein said coating is shaped.

33. The LED chip of claim 21, wherein said coating comprises one or more phosphors.

34. The LED chip of claim 33, wherein said coating comprises portions having different concentrations of phosphors.

35. The LED chip of claim 21, wherein said pedestal is exposed for external connection.

36. The LED chip of claim 21, wherein said coating is planarized to expose a top surface of said pedestal.

37. The LED chip of claim 21, wherein said contact is directly on one of said LED.

38. The LED chip of claim 21, wherein said pedestal comprises a single layer.

39. A light emitting diode (LED) chip wafer, comprising:
a plurality of LEDs comprising semiconductor layers, each of said LEDs comprising at least one textured surface to enhance light extraction, wherein said semiconductor layers are continuous between at least two of said plurality of LEDs;
a plurality of contacts, each of said contacts being on one of said textured surfaces;
a plurality of pedestals, each of which in electrical contact with and formed on one of said contacts; and
a coating at least partially covering said LEDs and comprising a light emitting surface, at least some of said pedestals extending through said light emitting surface and exposed at the surface of said coating for electrical contact, wherein said coating is conformal such that said coating comprises a substantially uniform thickness over said at least one textured surface.

40. The LED chip wafer of claim 39, wherein at least one of said pedestals comprises stud bumps.

41. The LED chip wafer of claim 39, wherein at least one of said pedestals comprises a microwire.

42. The LED chip wafer of claim 39, further comprising at least one current spreading structure on one of said LEDs, said current spreading structure in electrical contact with at least one of said contacts.

43. The LED chip wafer of claim 39, further comprising at least one current spreading layer.

44. The LED chip wafer of claim 39, wherein said textured LED surface comprises texture features that are larger than 10% of the thickness of said LED.

45. The LED chip wafer of claim 39, said coating comprises a textured surface.

46. The LED chip wafer of claim 45, wherein said coating textured surface comprises features larger than 10% of the thickness of said coating.

47. The LED chip wafer of claim 39, further comprising a groove between two adjacent LEDs, said coating at least partially filling said groove.

48. The LED chip wafer of claim 39, wherein said coating comprises multiple phosphors.

49. The LED chip wafer of claim 39, wherein said coating comprises scattering particles.

50. The LED chip wafer of claim 39, wherein said coating comprises a phosphor loaded binder.

51. The LED chip wafer of claim 39, wherein said LEDs are interconnected in an LED array.

52. The LED chip wafer of claim 39, further comprising a reflective layer formed integral to said substrate wafer.

53. The LED chip wafer of claim 39, wherein said coating comprises multiple portions with different concentrations of phosphors.

54. The LED chip wafer of claim 39, capable of emitting white light from said LEDs and coating.

55. The LED chip wafer of claim 39, wherein said pedestal is exposed for external connection.

56. The LED chip wafer of claim 39, wherein said coating is planarized to expose a top surface of said pedestal.

57. The LED chip wafer of claim 39, wherein said contact is directly on one of said textured surfaces.

58. The LED chip wafer of claim 39, wherein at least one of said plurality of pedestals comprises a single layer.

* * * * *